(12) United States Patent
Kiyooka et al.

(10) Patent No.: US 10,803,930 B2
(45) Date of Patent: Oct. 13, 2020

(54) MEMORY SYSTEM INCLUDING A MEMORY CONTROLLER AND ERROR CORRECTION CIRCUIT FOR READING MULTI-BIT DATA AND FOR DETECTING AND CORRECTING READ DATA ERRORS

(71) Applicant: Toshiba Memory Corporation, Minato-ku (JP)

(72) Inventors: Masahiro Kiyooka, Yokohama (JP); Yoshihisa Kojima, Kawasaki (JP); Toshikatsu Hida, Yokohama (JP)

(73) Assignee: Toshiba Memory Corporation, Minato-ku (JP)

( * ) Notice: Subject to any disclaimer, the term of this patent is extended or adjusted under 35 U.S.C. 154(b) by 30 days.

(21) Appl. No.: 16/123,123

(22) Filed: Sep. 6, 2018

(65) Prior Publication Data

US 2019/0295635 A1 Sep. 26, 2019

(30) Foreign Application Priority Data

Mar. 22, 2018 (JP) .................................. 2018-054771

(51) Int. Cl.
*G11C 11/56* (2006.01)
*G11C 16/26* (2006.01)
*H03M 13/11* (2006.01)
*G06F 11/10* (2006.01)

(52) U.S. Cl.
CPC ...... *G11C 11/5642* (2013.01); *G06F 11/1048* (2013.01); *G06F 11/1076* (2013.01); *G11C 16/26* (2013.01); *H03M 13/1105* (2013.01)

(58) Field of Classification Search
CPC . G11C 11/5642; G11C 16/16; G06F 11/1048; G06F 11/1076
USPC .......... 365/185.03, 189.011, 185.04, 185.18, 365/185.23
See application file for complete search history.

(56) References Cited

U.S. PATENT DOCUMENTS

| 8,782,496 | B2 | 7/2014 | Sakaue et al. |
| 8,929,140 | B2 | 1/2015 | Nagashima |
| 9,195,536 | B2 | 11/2015 | Sakaue |
| 9,329,935 | B2 | 5/2016 | Cohen et al. |
| 10,468,096 | B2 * | 11/2019 | Chen ................... G11C 11/5642 |

(Continued)

FOREIGN PATENT DOCUMENTS

| JP | 2012-244305 | 12/2012 |
| JP | 2013-080450 | 5/2013 |

(Continued)

*Primary Examiner* — Connie C Yoha
(74) *Attorney, Agent, or Firm* — Oblon, McClelland, Maier & Neustadt, L.L.P.

(57) ABSTRACT

According to one embodiment, a memory system comprising includes a semiconductor memory and a memory controller. The memory controller is configured to obtain first data read from the semiconductor memory using a first voltage, obtain second data read from the semiconductor memory using a second voltage, calculate a first value for a first section of the first data using the first data and the second data, calculate a second value for a second section of the first data using the first data and the second data, calculate a third value for a third section of the first data using the first data and the second data, and correct an error of the first data using the first to third values.

15 Claims, 25 Drawing Sheets

(56) References Cited

U.S. PATENT DOCUMENTS

| | | | |
|---|---|---|---|
| 2009/0106485 A1* | 4/2009 | Anholt | G11C 11/5642 711/103 |
| 2011/0083060 A1 | 4/2011 | Sakurada et al. | |
| 2012/0224420 A1* | 9/2012 | Sakurada | G11C 11/5642 365/185.03 |
| 2013/0077400 A1 | 3/2013 | Sakurada | |
| 2016/0259683 A1 | 9/2016 | Sakurada | |
| 2018/0076832 A1 | 3/2018 | Haga | |

FOREIGN PATENT DOCUMENTS

| | | |
|---|---|---|
| JP | 5197544 | 5/2013 |
| JP | 2018-045387 | 3/2018 |

* cited by examiner

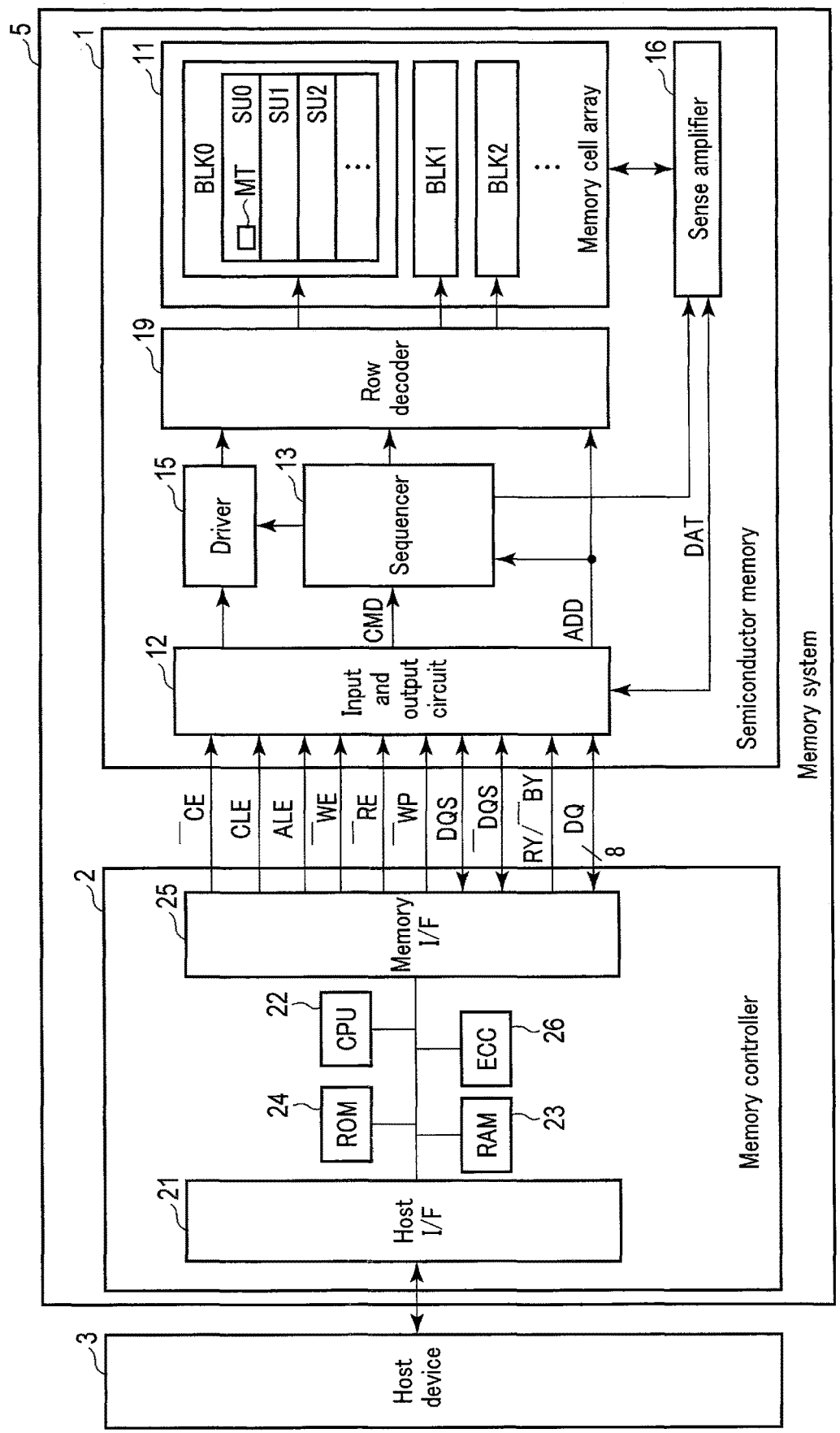
F I G. 1

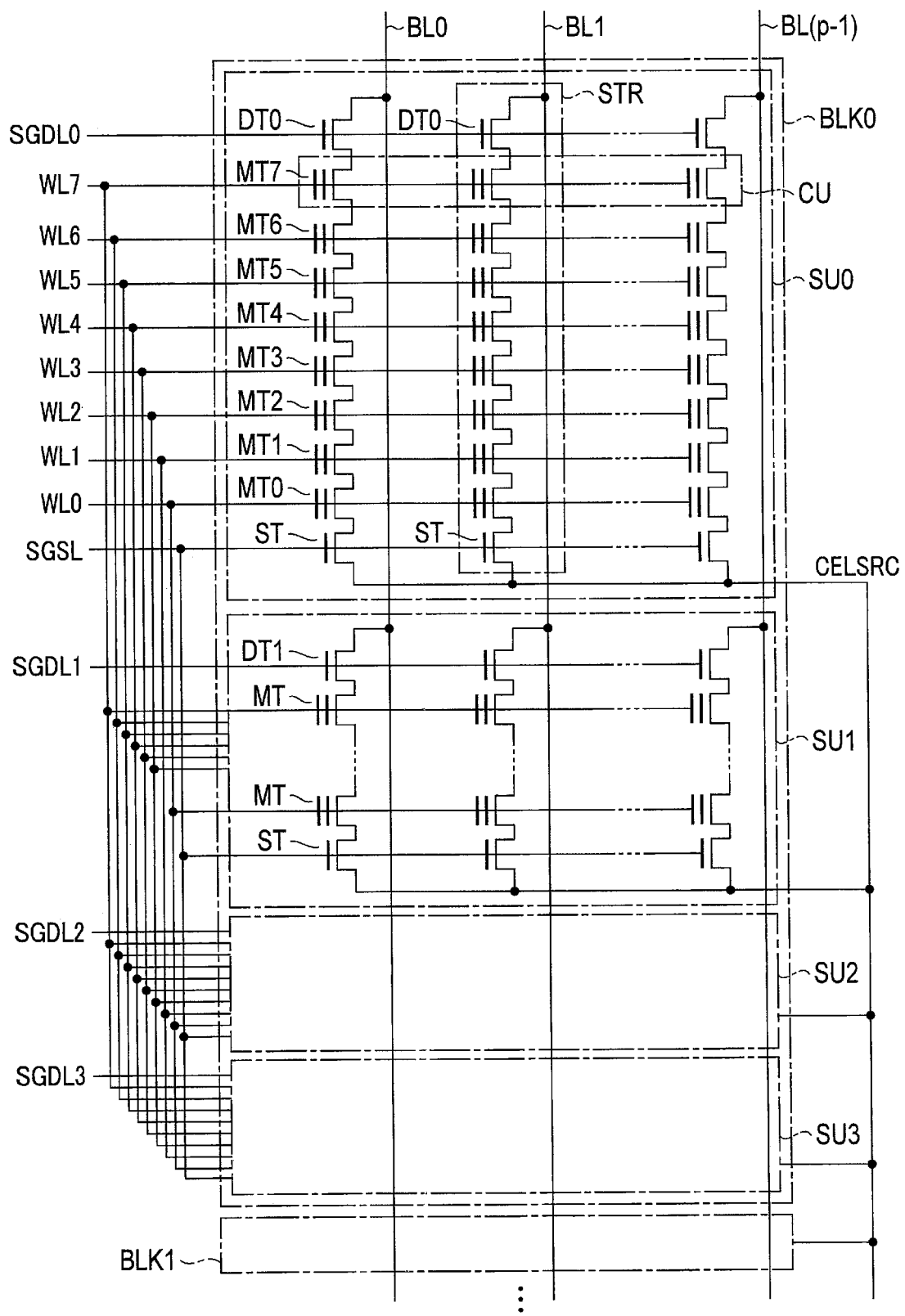
F I G. 2

| Read data | 1 | 0 | 0 | 0 | 1 | 1 | 0 | ... |
|---|---|---|---|---|---|---|---|---|
| LLR value | −9 | 1 | 1 | 3 | −5 | −1 | 9 | ... |

Read number table

| n | LLRn |
|---|---|
| 1 | 3 |
| 2 | 3 |
| 3 | 3 |
| 4 | 5 |
| 5 | 6 |
| 6 | 7 |
| 7 | 9 |

F I G. 11

Maximum shift amount table

| d | LLRd |
|---|---|
| 0 | 3 |
| 0.05 | 4 |
| 0.10 | 5 |
| 0.15 | 6 |
| 0.20 | 7 |
| 0.25 | 8 |
| 0.30 | 9 |

F I G. 12

(a)

Read 1 (initial read)
↓
Read 2 (shift read 1)
↓
Read 3 (shift read 2)
↓
Read 4 (shift read 3)
↓
Read 5 (shift read 4)
↓
Read 6 (shift read 5)
↓
Read 7 (shift read 6)
↓
Read 8 (shift read 7)
↓
SB decoding (b)

Read 1 (initial read)
↓
SB decoding 1
↓
Read 2 (shift read 1)
↓
SB decoding 2
↓
Read 3 (shift read 2)
↓
SB decoding 3
↓
Read 4 (shift read 3)
↓
SB decoding 4
↓
Read 5 (shift read 4)
↓
SB decoding 5
↓
Read 6 (shift read 5)
↓
SB decoding 6
↓
Read 7 (shift read 6)
↓
SB decoding 6
↓
Read 8 (shift read 7)
↓
SB decoding

F I G. 13

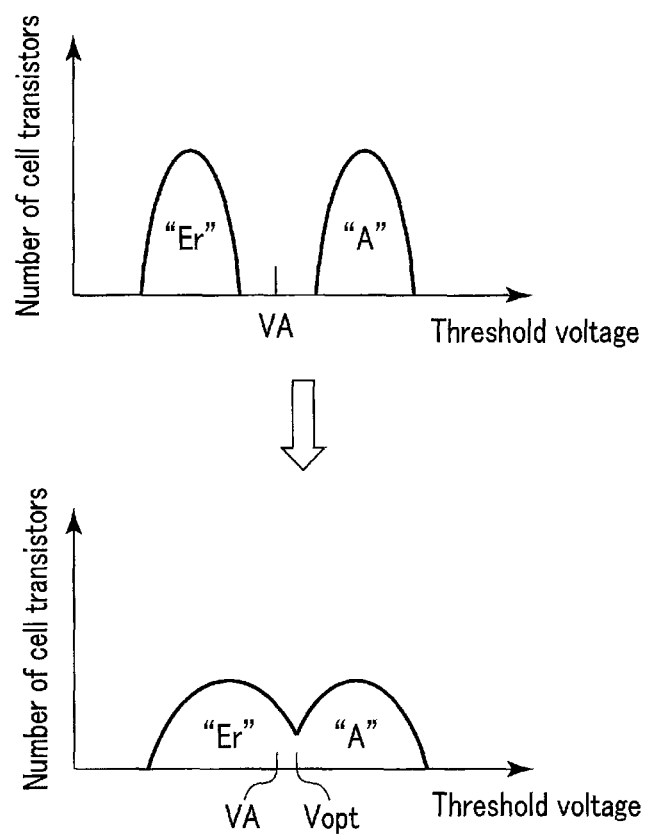
F I G. 15

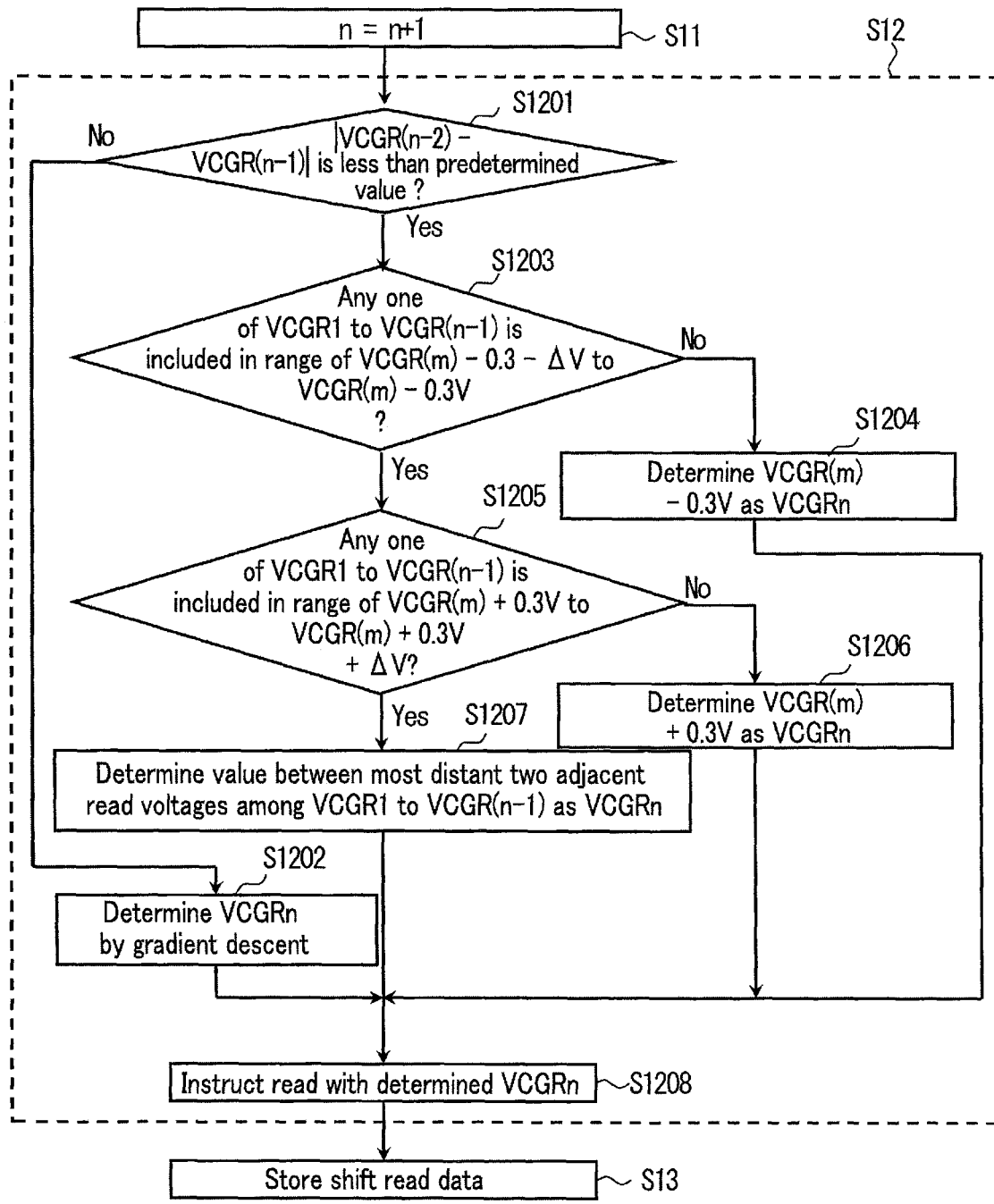
F I G. 18

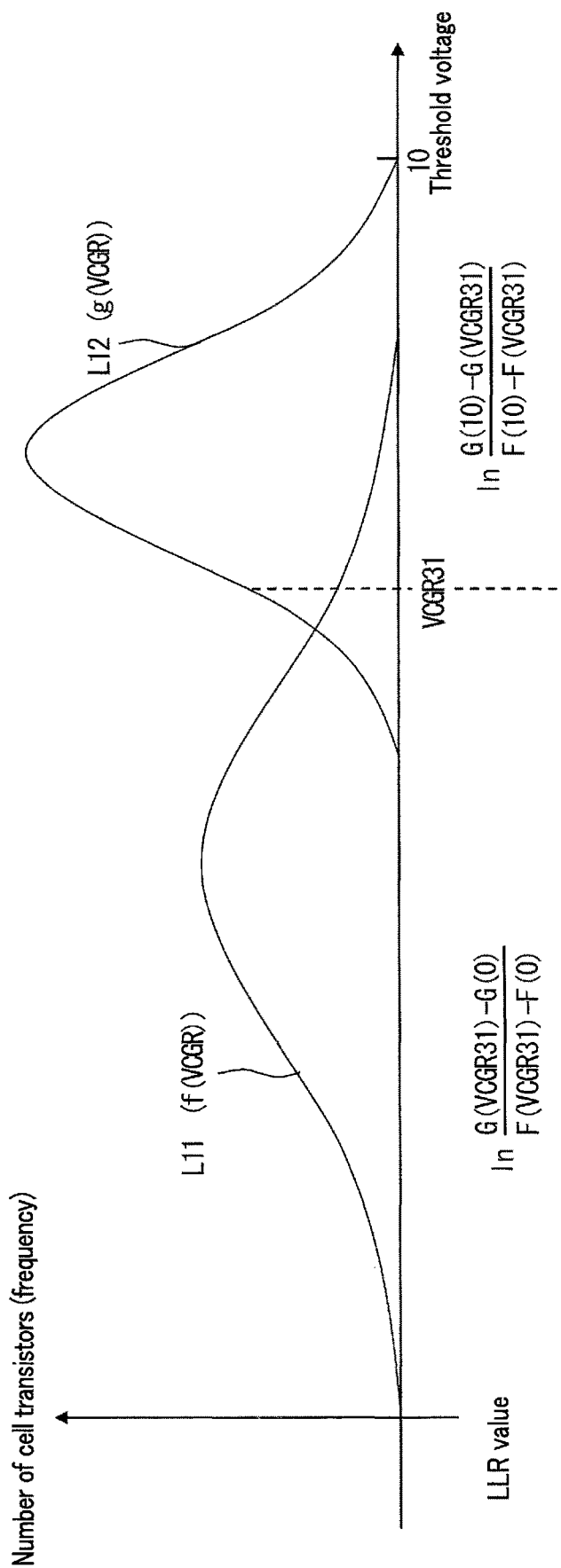
F I G. 25

MEMORY SYSTEM INCLUDING A MEMORY CONTROLLER AND ERROR CORRECTION CIRCUIT FOR READING MULTI-BIT DATA AND FOR DETECTING AND CORRECTING READ DATA ERRORS

CROSS-REFERENCE TO RELATED APPLICATIONS

This application is based upon and claims the benefit of priority from Japanese Patent Application No. 2018-54771, filed Mar. 22, 2018, the entire contents of which are incorporated herein by reference.

FIELD

Embodiments described herein relate generally to a memory system.

BACKGROUND

A memory system including a semiconductor memory and a controller to control the semiconductor memory is known.

BRIEF DESCRIPTION OF THE DRAWINGS

FIG. 1 shows components and connections in a memory system according to a first embodiment and an associated component;

FIG. 2 shows an example of components and connections in a block according to the first embodiment;

FIG. 11 shows a read number table according to the first embodiment;

FIG. 12 shows a maximum shift amount table according to the first embodiment;

FIG. 13 schematically shows a flow of processing in data read and SB decoding in an example for reference and the first embodiment;

FIG. 15 shows a change in the threshold voltage distribution in the first embodiment;

FIG. 18 shows a flow of a part of an operation of a memory system according to a second embodiment;

FIG. 25 shows the details of an example of LLR value calculation according to the third embodiment;

DETAILED DESCRIPTION

Figure 3:
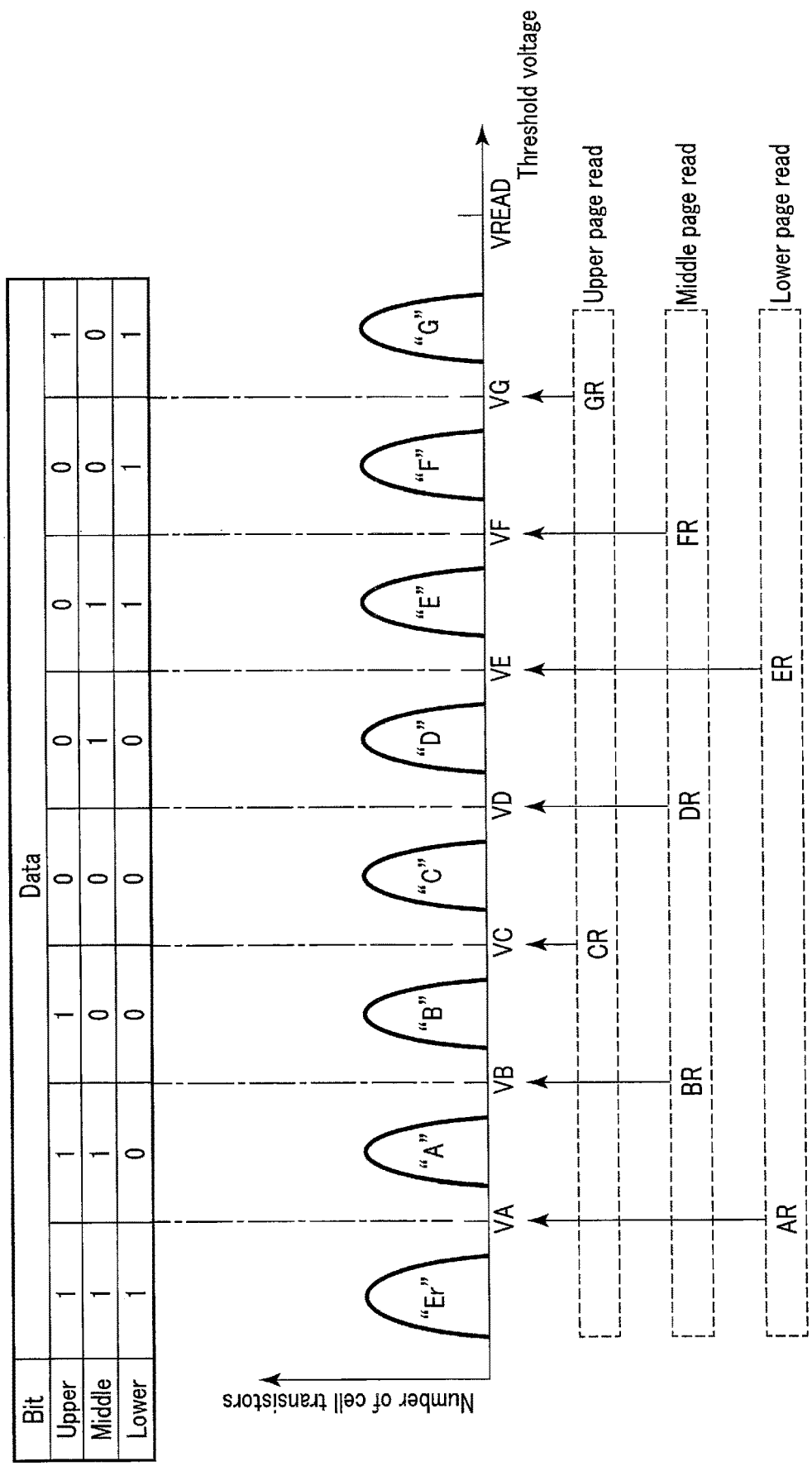
FIG. 3 shows an example of a threshold voltage distribution of cell transistors according to the first embodiment.

According to one embodiment, a memory system comprising includes a semiconductor memory and a memory controller. The memory controller is configured to obtain first data read from the semiconductor memory using a first voltage, obtain second data read from the semiconductor memory using a second voltage, calculate a first value for a first section of the first data using the first data and the second data, calculate a second value for a second section of the first data using the first data and the second data, calculate a third value for a third section of the first data using the first data and the second data, and correct an error of the first data using the first to third values.

Embodiments will now be described with reference to the figures. In the following description, components with substantially the same functionalities and configurations will be referred to with the same reference numerals, and repeated descriptions may be omitted. The entire description for a particular embodiment also applies to another embodiment unless it is explicitly mentioned otherwise or obviously eliminated.

Each embodiment merely illustrates a device and method for materializing the technical idea of that embodiment. Each functional block can be implemented as hardware, computer software, or combination of the both. For this reason, in order to clearly illustrate that each block can be any of hardware, software or combination, descriptions will be made in terms of their functionalities in general. It is not necessary that functional blocks are distinguished as in the following examples. For example, some of the functions may be implemented by functional blocks different from those illustrated below.

Furthermore, an illustrated functional block may be divided into functional sub-blocks.

Moreover, any step in a flow of a method of an embodiment is not limited to any illustrated order, and can occur in an order different from an illustrated order and/or can occur concurrently with another step.

In the specification and the claims, a phrase of a particular first component being "coupled" to another second component includes the first component being coupled to the second component either directly or via one or more components which are always or selectively conductive.

First Embodiment

<1. Structure (Configuration)>

FIG. 1 shows components and connections in a memory system according to a first embodiment and an associated component. As shown in FIG. 1, a memory system 5 is controlled by a host device 3 and includes a semiconductor memory 1 and a memory controller 2. The memory system 5 can be, for example, a solid state drive (SSD), a SD™ card, or the like.

The semiconductor memory 1 is controlled by the memory controller 2. The memory controller 2 receives instructions from the host device 3 and controls the semiconductor memory 1 based on the received instructions.

<1.1. Memory Controller>

The memory controller 2 includes a host interface 21, a central processing unit (CPU) 22, a random access memory (RAM) 23, a read only memory (ROM) 24, a memory interface 25, and an error correction code (ECC) circuit 26. The memory controller 2 can be configured as, for example, a system-on-a-chip (SoC). A firmware (i.e., program) stored in the ROM 24 and loaded on the RAM 23 is executed by the CPU 22, so that the memory controller 2 executes various operations and a part of functions of the host interface 21 and the memory interface 25. The RAM 23 temporarily stores data and functions as a buffer and a cache.

The host interface 21 is connected to the host device 3 via a bus and manages communications between the memory controller 2 and the host device 3. The memory interface 25 is connected to the semiconductor memory 1 and manages communications between the memory controller 2 and the semiconductor memory 1.

The ECC circuit 26 performs processing necessary for detecting and correcting an error on data to be programmed in the semiconductor memory 1 and data read from the semiconductor memory 1. Specifically, the ECC circuit 26 generates redundant data for error correction of data (substantial program data) to be programmed in the semiconductor memory 1. The generated redundant data and the substantial program data are programmed in the semiconductor memory 1. Therefore, data read from the semiconductor memory 1 includes substantial program data and corresponding redundant data.

In addition, the ECC circuit 26 detects an error in the data read from the semiconductor memory 1 and attempts to correct the error when there is an error. The ECC circuit 26 can perform error correction based on hard decision and error correction based on soft decision, for example. The ECC for the hard decision decoding and the soft decision decoding can be, for example, a Bose Chaudhuri Hocquenghem (BCH) code, a Reed Solomon code, and/or a low-density parity check (LDPC) code. The ECC circuit 26 will be described in detail later.

<1.2. Semiconductor Memory>

The semiconductor memory 1 includes components such as a memory cell array 11, an input and output circuit 12, a sequencer (i.e., control circuit) 13, a driver 15, a sense amplifier 16, and a row decoder 19.

The cell array 11 includes memory blocks BLK (BLK0, BLK1, . . . ). Each block BLK is a collection of string units SU (SU0, SU1, . . . ). Each string unit SU is a collection of NAND strings (strings) STR (STR0, STR1, . . . ) (not shown in the drawings). The string STR includes memory cell transistors MT.

The input and output circuit 12 is connected to the memory controller 2 via a NAND bus. The NAND bus transmits control signals and a signal DQ having a width of eight bits. The control signals include signals ⁻CE, CLE, ALE, ⁻WE, ⁻RE, ⁻WP, and data strobe signals DQS and ⁻DQS. The input and output circuit 12 receives and transmits the signal DQ. The input and output circuit 12 receives the control signals from the memory controller 2, and fetches and outputs the signal DQ based on the control signal. The signal DQ includes a command (CMD), program data or data (DAT), an address (ADD), a status (STA), and the like.

The sequencer 13 receives the command CMD and the address ADD from the input and output circuit 12 and controls the driver 15, the sense amplifier 16, and the row decoder 19, based on the command CMD and the address ADD.

The driver 15 supplies a selected one of potentials to the row decoder 19. The row decoder 19 receives various potentials from the driver 15, receives the address ADD from the input and output circuit 12, and transfers potentials from the driver 15 to one block BLK selected based on the received address ADD.

The sense amplifier 16 senses a state of the cell transistors MT, generates read data based on the sensed state, and transfers the program data to the cell transistors MT.

<1.3. Cell Array>

FIG. 2 shows an example of some components and connections in the cell array 11 according to the first embodiment, and shows components and connections of one block BLK0 and associated components. A plurality of (for example, all) blocks BLK include the components and connections shown in FIG. 2.

One block BLK includes a plurality of (for example, four) string units SU0 to SU3.

Each of p (p is a natural number) bit lines BL0 to BL(p−1) is coupled to one string STR from each of the string units SU0 to SU3 in each block BLK.

Each string STR includes one select gate transistor ST, a plurality of (for example, eight) memory cell transistors MT (MT0 to MT7), and one select gate transistor DT (DT0, DT1, DT2, or DT3). The transistors ST, MT, and DT are coupled in series between a source line CELSRC and one bit line BL in this order. Each cell transistor MT includes a control gate electrode (word line WL) and a charge storage layer insulated from the surroundings, and can store data in a non-volatile manner based on the amount of the electric charge in the charge storage layer.

Strings STR respectively coupled to different bit lines BL form one string unit SU. In each string unit SU, the control gate electrodes (gates) of the cell transistors MT0 to MT7 are coupled to word lines WL0 to WL7, respectively. Furthermore, in each block BLK, word lines WL of the same addresses in the different string units SU are also connected to each other. A set of cell transistors MT sharing one word line WL in one string unit SU is referred to as a cell unit CU.

The transistors DT0 to DT3 belong to the string units SU0 to SU3, respectively. For each case of α=0, 1, 2, and 3, the gate of each transistor DTα of each of strings STR of a string unit SUα is coupled to a select gate line SGDLα. The gates of the transistors ST are coupled to a select gate line SGSL.

<1.4. Cell Transistor>

Referring to FIG. 3, the cell transistors MT will be described. The semiconductor memory 1 can store data of two bits or more in one cell transistor MT. FIG. 3 shows a distribution of threshold voltages of the cell transistors MT each storing three-bit data per cell transistor MT as a result of programming. The threshold voltage of each cell transistor MT has a magnitude according to the stored data. In the case of storage of three bits per cell transistor MT, each cell transistor MT can have any one of eight threshold voltages. Cell transistors with the eight threshold voltages are in a state where they store "111" data, "110" data, "100" data, "000" data, "010" data, "011" data, "001" data, and "101" data, respectively. The cell transistors MT in a state of storing the "111" data, the "110" data, the "100" data, the "000" data, the "010" data, the "011" data, the "001" data, and the "101" data are referred to as being in Er, A, B, C, D, E, F, and G states respectively.

Even cell transistors MT storing the same three-bit data, they may have different threshold voltages due to their characteristic variations or the like. Therefore, the threshold voltages of the cell transistors MT storing the same three-bit data have different threshold voltages. In FIG. 3 and the following drawings, the distribution of the threshold voltage is shown as a continuous curve. However, in actuality, the numbers of cell transistors are discrete.

To distinguish the data stored in a read-target cell transistor MT, the state of the cell transistor MT is determined. To determine the state, read voltages VA, VB, VC, VD, VE, VF, and VG are used. Hereinafter, a voltage of a certain magnitude including the read voltages VA, VB, VC, VD, VE, VF, and VG and applied to the read-target cell transistor MT for state determination may be referred to as a read voltage VCGR.

Whether or not the threshold voltage of the read-target cell transistor MT exceeds the read voltage VCGR is used for determining a state of the cell transistor MT. A cell transistor MT having a threshold voltage equal to the read voltage VCGR or more remains off even while it is receiving the read voltage VCGR in the control gate electrode. On the other hand, a cell transistor MT having a threshold voltage of less than the read voltage VCGR remains on while it is receiving the read voltage VCGR in the control gate electrode. A voltage VREAD is applied to the word lines WL of the cell transistors MT of a cell unit CU as a non-read target, and is higher than the threshold voltage of the cell transistors MT in any state.

A set of data at bits of the same position (digit) of cell transistors MT of one cell unit CU forms one page.

Data of a certain page, for example, a lower page is determined by read using the read voltage VA (hereinafter, read using a read voltage Vβ (β is A, B, C, D, E, F, or G) is referred to as β read) and E read.

The threshold voltage ofs the cell transistors MT can vary due to factors such as disturbance and/or a lapse of time immediately after being programmed. The threshold voltage of a cell transistor MT may be erroneously determined as a state different from a state intended to be in when it is programmed, depending on a manner of variation.

<1.5. ECC Circuit and Associated Components>

Figures 4, 5:
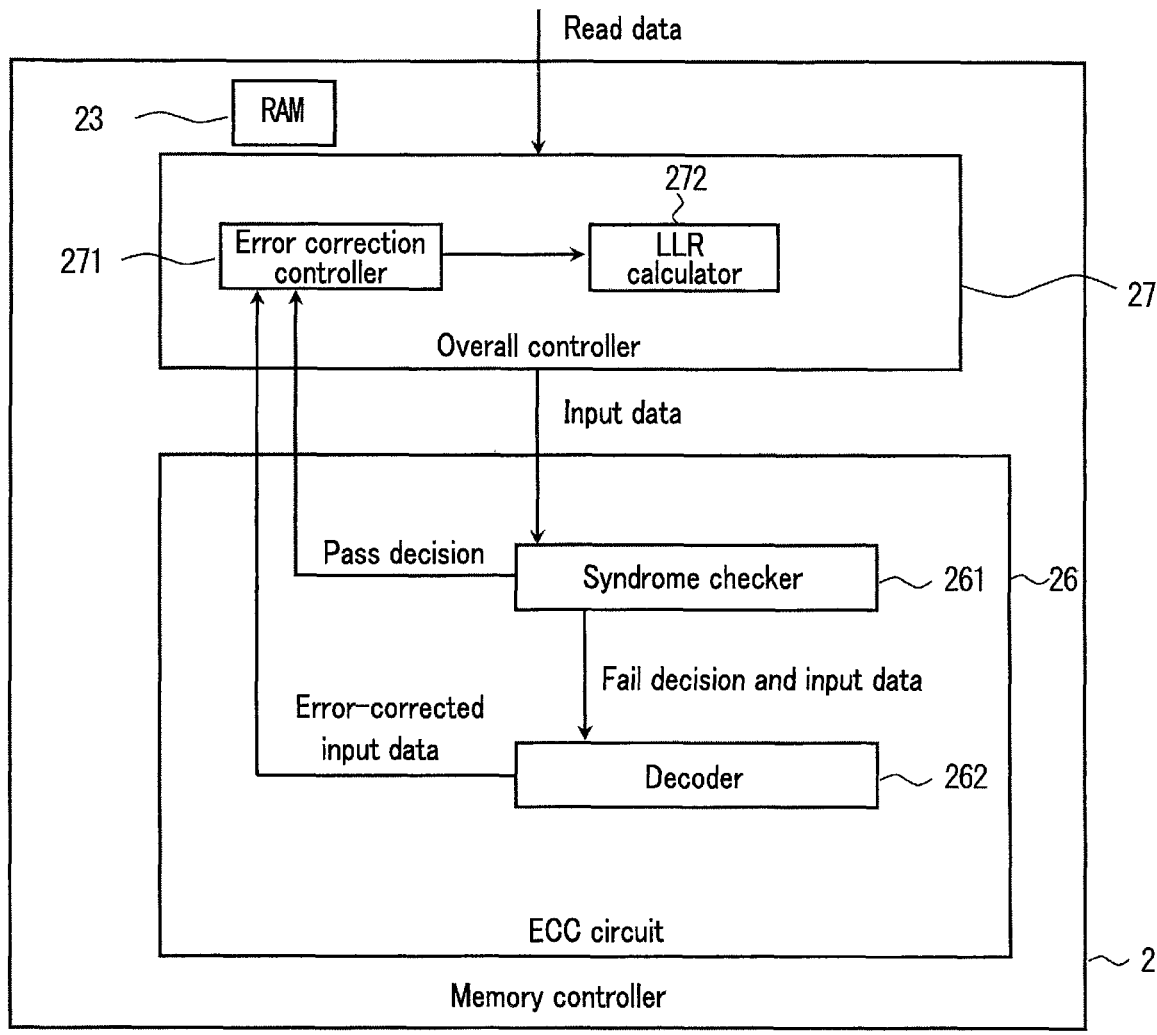
FIG. 4 shows components and connections in an ECC circuit according to the first embodiment and functional blocks associated with the ECC circuit in a memory controller.
FIG. 5 shows an example of a correspondence between read data and LLR values in the first embodiment.

FIG. 4 shows components and connections in the ECC circuit 26 and functional blocks associated with the ECC circuit 26 in the memory controller 2. The memory controller 2 has an overall controller 27. The overall controller 27 is realized by a combination of parts of the respective functions of the CPU 22, the RAM 23, and the ROM 24.

The overall controller 27 controls an overall operation of the memory controller 2. Such control includes control of the ECC circuit 26. The overall controller 27 instructs the semiconductor memory 1 to read read-target data via the memory interface 25, as a part of read of data from the semiconductor memory 1. When the overall controller 27 receives the read-target data, the overall controller 27 attempts to correct an error in the received data (read data) as necessary. To correct the error in the read data, the overall controller 27 performs various processing, which is described below, and controls the ECC circuit 26. Processing for error correction by the overall controller 27 includes determination and calculation of one or more log likelihood ratio (LLR) values.

The overall controller 27 includes an error correction controller 271 and an LLR calculator 272. The error correction controller 271 controls the error correction in the read data by the ECC circuit 26 and controls the LLR calculation unit 272 and the ECC circuit 26.

The LLR calculation unit 272 can calculate LLR values regarding the read data, based on the control of the error correction controller 271. As shown in FIG. 5, each LLR value is associated with one bit in the read data and shows a likelihood (likelihood ratio) of the data of the associated bit. Each box in a first row shows one bit in the read data. Each box in a second row is associated with the bit in the box thereabove and shows an LLR value for the data of the associated bit. An LLR value of a larger absolute value represents that corresponding bit data is more likely. A sign of the LLR value represents a polarity (1 or 0) of the corresponding bit data. For example, a positive LLR value indicates that it is likely to estimate that corresponding bit data is 0 and a negative LLR value indicates that it is likely to estimate that corresponding bit data is 1.

Referring back to FIG. 4, the ECC circuit 26 receives data (for example, read data) (hereinafter, referred to as input data) from the overall controller 27 and can perform decoding on each data of a size referred to as a frame, for example. The input data to the ECC circuit 26 may be the read data read from the semiconductor memory 1 or may be a set of LLR values (a LLR value set). When the error correction succeeds, error-corrected (correct) input data is obtained. When the ECC circuit 26 succeeds in the error correction, the ECC circuit 26 supplies a signal indicating pass determination and the error-corrected input data to the overall controller 27. When the error correction fails, the ECC circuit 26 notifies the overall controller 27 of fail determination.

The ECC circuit 26 includes a syndrome checker 261 and a decoder 262. The syndrome checker 261 can calculate a syndrome of input data to the ECC circuit 26. The syndrome checker 261 stores a check matrix, for example, and can calculate a syndrome vector for input data (frame) using the input data and the check matrix. In addition, the syndrome checker 261 can calculate the number of 1 bits (the Hamming weight Wh(s) of the syndrome) (hereinafter, abbreviated as the syndrome NG number) in the calculated syndrome vector.

In addition, the syndrome checker 261 determines whether input data (for example, an LLR value set) to the syndrome checker 261 is a pass or a fail based on the calculated syndrome. In the case of pass determination, it is considered that the input data does not include an error. The syndrome checker 261 supplies a signal indicating the pass determination to the error correction controller 271. On the other hand, in the case of fail determination, the syndrome checker 261 supplies a signal indicating the fail determination and input data (frame) to the decoder 262.

When the decoder 262 receives the signal indicating the fail determination, the LLR value set, and the read data from the syndrome checker 261, the decoder 262 performs SB decoding using the received LLR value set and supplies the error-corrected read data to the error correction controller 271 (in particular, the RAM 23).

<2. Operation>

An operation of the memory system 5 is described with reference to FIGS. 6 to 12. In the following description, for the purpose of simplifying description and facilitating understanding, an example where a read-target cell unit CU (select cell unit CU) stores data of one page, that is, an example where the selected cell unit CU stores one-bit data in each cell transistor MT is described. Read in an example where the selected cell unit CU stores data of two pages or more can be realized by combining the following description of an example in which the selected cell unit CU stores data of one page and other technology, which is described later.

Figure 6:
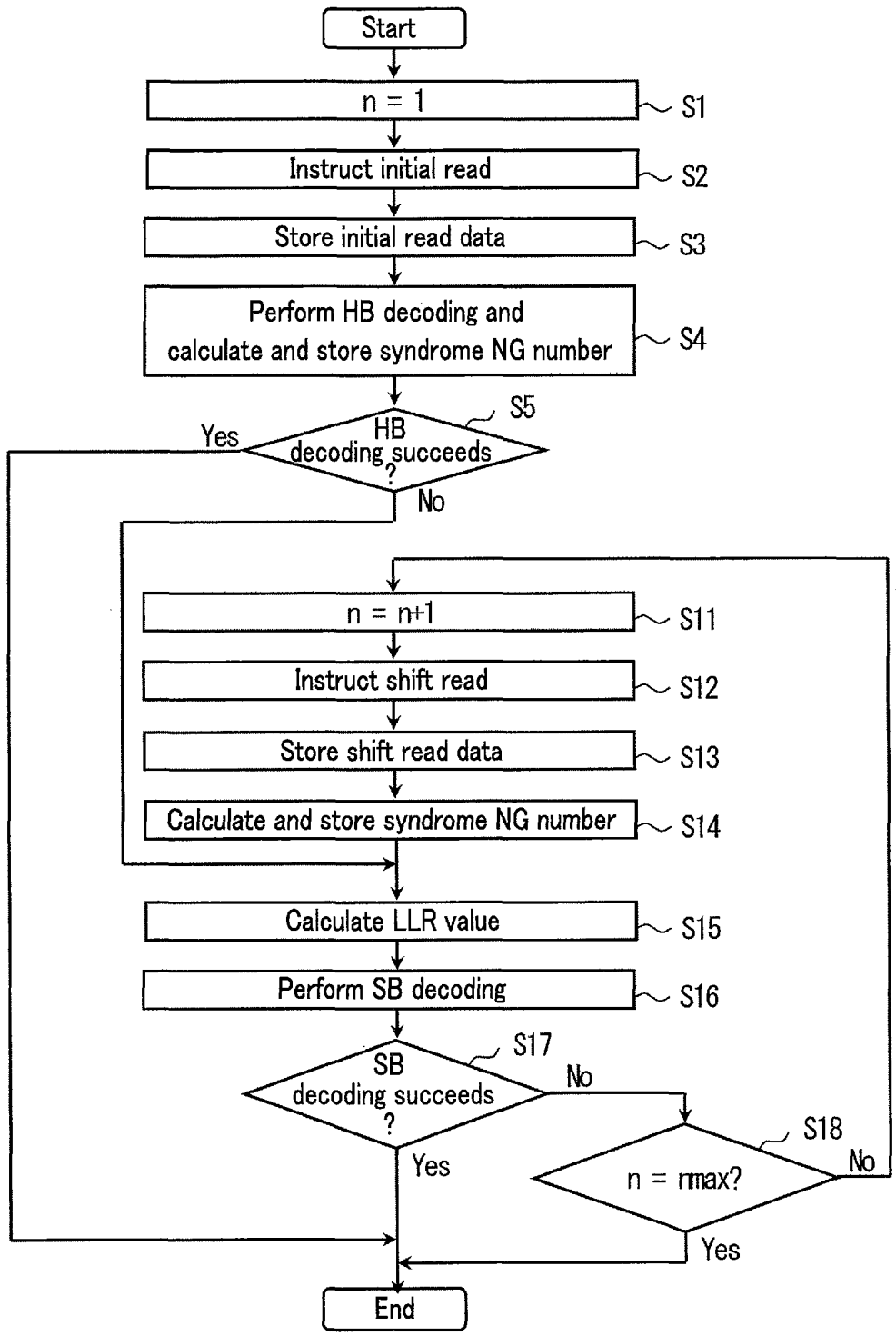
FIG. 6 shows a flow of a part of an operation of the memory system according to the first embodiment.

FIG. 6 shows a flow of a part of the operation of the memory system 5 according to the first embodiment. FIG. 6 shows a flow until data read from the page of a selected cell unit CU is error-corrected and error-corrected read data is obtained. As described above, the ECC circuit 26 processes data of a frame size. However, for the sake of simplification, the case where the ECC circuit 26 processes the data of the page size is described below. In actuality, the data from the selected cell unit CU is divided into frames, the flow shown in FIG. 6 is performed for the frame in the ECC circuit 26, and the flow shown in FIG. 6 is repeated for all frames. Details of some steps in FIG. 6 are described below.

In step S1, the error correction controller 271 sets the number of reads n to 1.

In step S2, the memory controller 2 reads data from the selected cell unit CU. The data read (or read) uses a read voltage VCGR (referred to as VCGR1) to be first used, such as a default voltage and a voltage shifted from the default voltage. Hereinafter, first read in the flow shown in FIG. 6 is referred to as initial read R1 in the case of using the shifted voltage as well as the case of using the default voltage.

In step S3, the memory controller 2 receives read data obtained by the initial read R1 (read using the read voltage VCGR1) and stores the read data in the RAM 23. Hereinafter, the data read using the read voltage VCGR1 is referred to as initial read data RD1.

In step S4, the error correction controller 271 controls the ECC circuit 26 and attempts to perform error correction (HB decoding) in the initial read data RD1 using substantial program data and redundant data in the initial read data RD1. In addition, as part of the HB decoding, the syndrome checker 261 calculates the syndrome NG number of the read data using an LDPC code in accordance with the control of the error correction controller 271. The syndrome checker 261 stores the syndrome NG number for the initial read data RD1 in the RAM 23 in association with the initial read data RD1.

When the HB decoding succeeds (Yes branch of step S5), the decoder 262 supplies the error-corrected read data to the overall controller 27 and the flow ends. When the syndrome NG number calculated in step S4 is zero, this means that the read data does not include an error. Therefore, even if the HB decoding is not actually performed, read data including no error is obtained and also in this case, the flow ends.

When the HB decoding fails (No branch of step S5), the process proceeds to step S15. The error correction controller 271 attempts error correction (SB decoding) of the read data using the LLR values in steps S11, S12, S13, S14, S15, S16, S17, and S18. Further processing may be performed between step S5 and step S15. The further processing can include estimation of a better read voltage VCGR (which is expected to include fewer error bit counts FBC (fail bit counts) in the read data), read using the estimated read voltage VCGR, and HB decoding, and/or read using the read voltage VCGR different from the read voltage VCGR1 and the HB decoding.

The error correction controller 271 repeats a set of steps S11 to S18 until the SB decoding in step S16 succeeds or until the number of reads n reaches a maximum value, as described later. Hereinafter, a first set of steps S15, S16, S17, and S18 after step S5 will be first described. The steps S1 to S5 and the first set of steps S15, S16, S17, and S18 after step S5 are referred to as an initial loop.

In step S15, the error correction controller 271 instructs the LLR calculation unit 272 to use read data obtained at the present time, that is, the initial read data RD1 in a current example, to calculate LLR values associated with the initial read data RD1. The LLR values correspond to all bits on one-to-one correspondence in the initial read data RD1 (in actuality, a frame that is being processed), so that a plurality of LLR values are calculated. The calculation is described in detail later. The error correction controller 271 supplies the obtained LLR values to the decoder 262.

In step S16, the error correction controller 271 and the decoder 262 cooperate with each other and attempt acquisition of the error-corrected read data RD1, that is, the SB decoding, using the calculated LLR values.

When the SB decoding succeeds (Yes branch of step S17), the error-corrected read data is obtained and the flow ends. When the SB decoding fails (No branch of step S17), the process proceeds to step S18. In step S18, the error correction controller 271 determines whether the number of reads n is a maximum number nmax. The maximum number nmax is, for example, seven. In the initial loop, because the number of reads n is less than the maximum number nmax, the process proceeds to step S11.

The error correction controller 271 performs a loop (second loop) of the set of steps S11 to S18. Any loop of the set of steps S11 to S18 after the first loop is referred to as a non-initial loop. Hereinafter, steps S11, S12, S13, and S14 in a non-initial loop are described.

In step S11, the error correction controller 271 increments the number of reads n by one.

In step S12, the error correction controller 271 instructs the semiconductor memory 1 to perform shift read via the memory interface 25. The shift read indicates read using a read voltage VCGR different from the read voltage VCGR (for example, read voltage VCGR1) in the initial read. A method of selecting the read voltage VCGR different from the read voltage VCGR1 in the initial read may be arbitrary and an example thereof is described in a second embodiment.

In step S12 in a certain non-initial loop, the error correction controller 271 specifies a read voltage VCGR different from any read voltage VCGR in the initial read (step S1) and the shift read (step S12) in all loops before that non-initial loop. That is, in a non-initial n-th loop, a read voltage VCGRn is specified and the read voltage VCGRn is also different from any read voltage VCGRγ (γ is a natural number of less than n). As a specific example, in step S12 in the second loop, the memory controller 2 instructs the semiconductor memory 1 to perform the shift read (referred to as shift read SR2). The shift read SR2 specifies a read voltage VCGR2 different from the read voltage VCGR1. The read voltage VCGR2 can have any magnitude difference with the read voltage VCGR1. When the shift read SR2 is instructed, the semiconductor memory 1 performs the shift read SR2 to obtain read data (referred to as shift read data RD2) and transmits the shift read data RD2 to the memory controller 2.

Hereinafter, the shift read in the n-th loop is referred to as shift read SRn and the shift read data in the n-th loop is referred to as shift read data RDn. In addition, when the initial read and the shift read do not need to be distinguished from each other, the initial read and the shift read may be simply referred to as read. Likewise, the initial read data RD1 and the shift read data RDn may be simply referred to as the read data RD1 and the read data RDn, respectively.

The read voltage VCGRn can have any magnitude and can be determined for the purpose of leading to read data that is more likely to be successfully decoded than read using the read voltages VCGR1 to VCGRn−1. A specific example of a method for doing so is described later and is described in the second embodiment.

In step S13 in the n-th loop, the overall controller 27 receives the shift read data RDn according to the instruction in step S12 in the n-th loop and stores the received shift read data in the RAM 23.

In step S14 in the n-th loop, the error correction controller 271 controls the syndrome checker 261 and calculates the syndrome NG number of the shift read data RDn stored in step S13 in the n-th loop, using the LDPC code. By the control of the error correction controller 271, the calculated syndrome NG number is associated with the shift read data RDn and is stored in the RAM 23. It is known that the syndrome NG number based on the LDPC code has a smaller value when the number of errors in the input (shift read data RDn in the current context) from which a syndrome vector is calsulated is smaller.

In step S15 in the n-th loop, as described above, the error correction controller 271 instructs the LLR calculator 272 to calculate the LLR values associated with the initial read data RD1, using all the read data obtained at the present time. As a specific example, in step S15 in the second loop, the error correction controller 271 calculates the LLR values using the initial read data RD1 and the shift read data RD2. Each time the loop is repeated, more read data RD is obtained. Therefore, each time the loop is repeated, LLR values based on more read data are calculated. The LLR values calculated in step S15 in the n-th loop may lead to successful SB decoding with a higher probability than the LLR values calculated in step S15 in the first to (n−1)-th loops.

In step S16 in the n-th loop, the error correction controller 271 attempts error correction of the read data from the select cell unit CU, that is, SB decoding, using the LLR values calculated in step S15 in the n-th loop.

In step S18 in the n-th loop, when n reaches the maximum number nmax, the SB decoding fails and the flow ends. In this case, the error correction controller 271 can attempt error correction by another method (for example, correction using a product code).

The HB decoding may be recognized as included in the SB decoding, the HB decoding in step S4 may be omitted and the SB decoding may be performed at a stage of n=1. In this case, in step S4, the SB decoding is performed instead of the HB decoding, and a No branch of step S4 continues to step S18.

<2.1 Step S15 (Calculation of LLR Value)>

Figure 7:
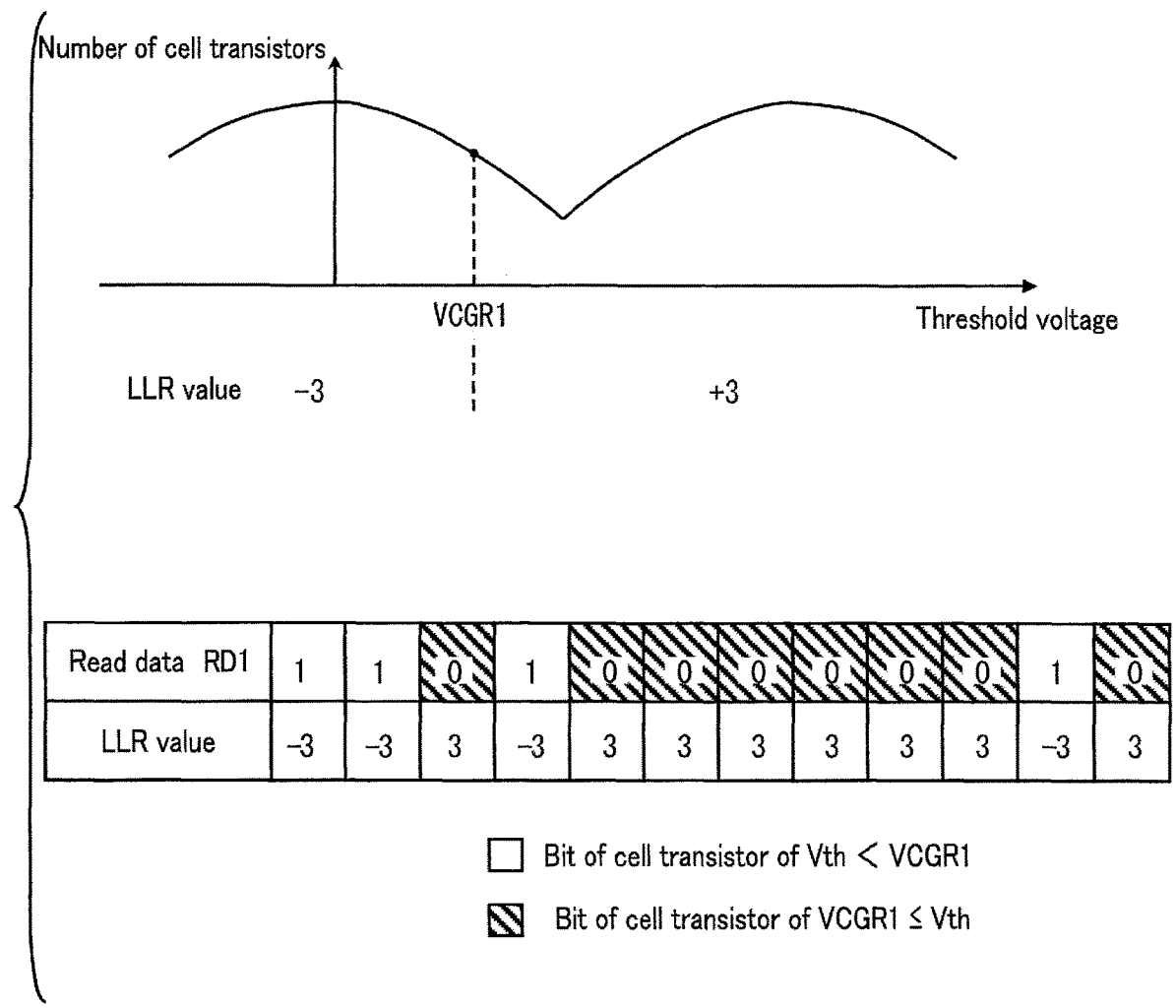
FIG. 7 shows the details of an example of LLR value calculation according to the first embodiment.
Figure 8:
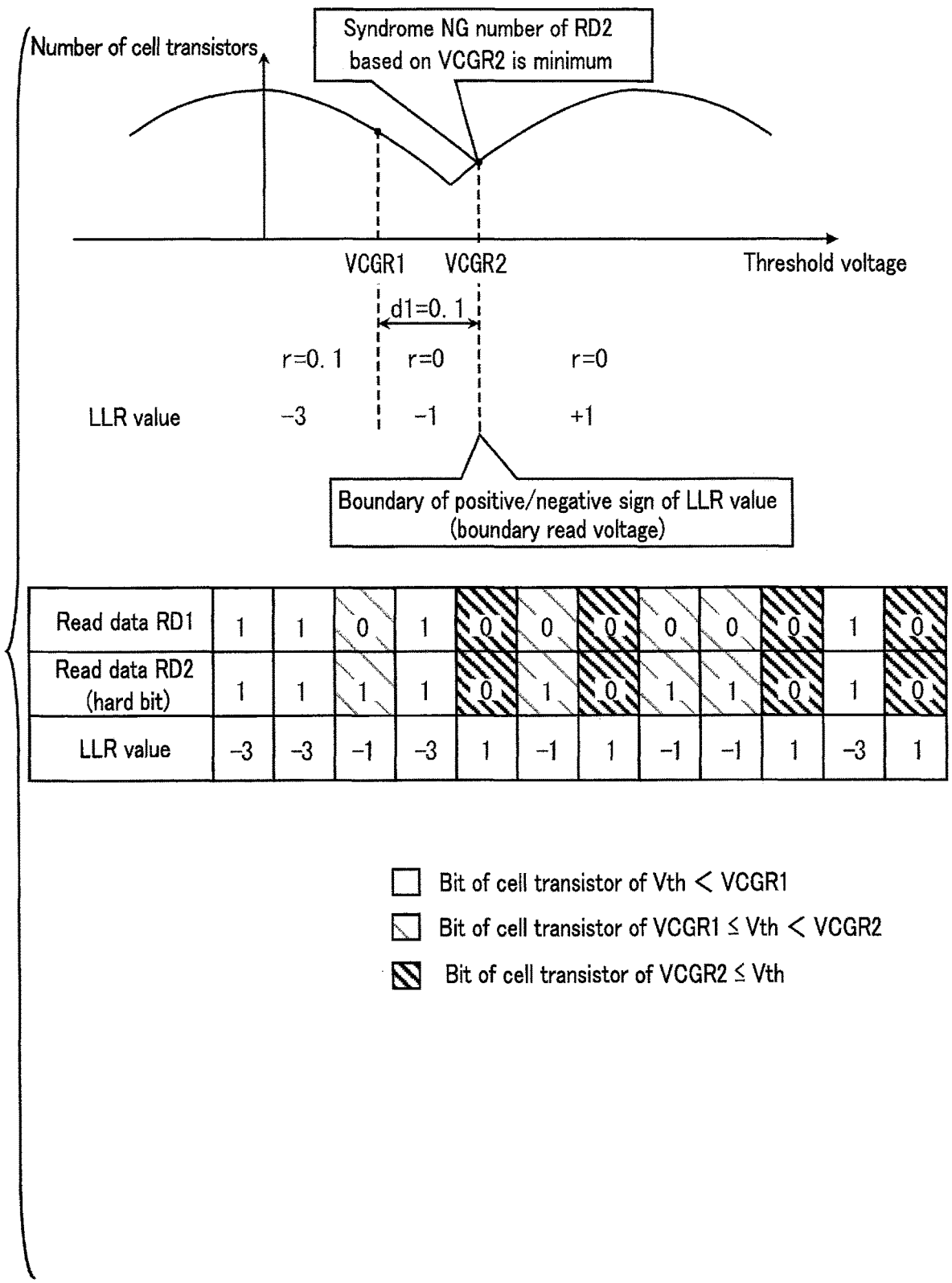
FIG. 8 shows the details of an example of LLR value calculation according to the first embodiment.
Figure 9:
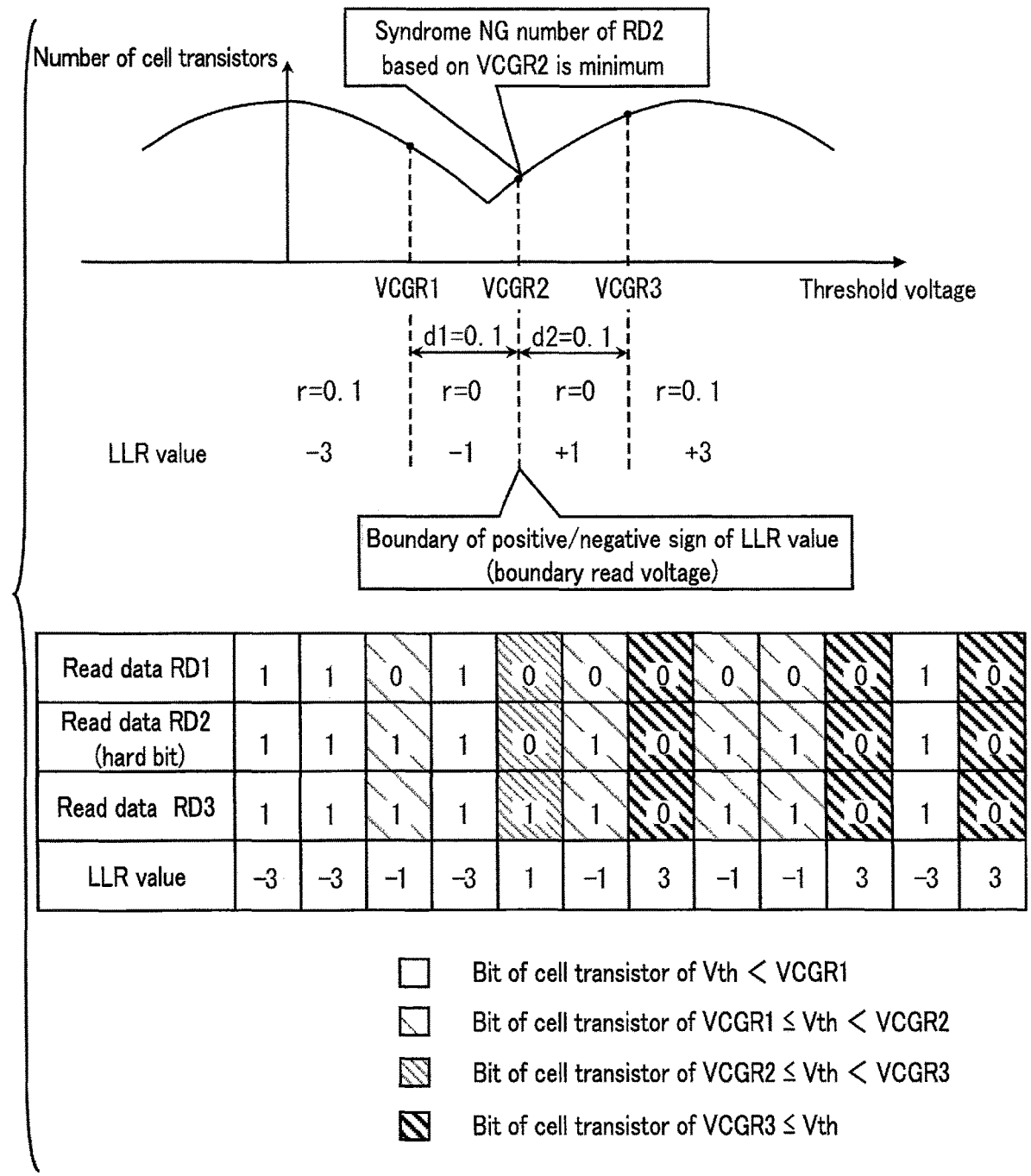
FIG. 9 shows the details of an example of LLR value calculation according to the first embodiment.

FIGS. 7 to 9 show the details of an example of the LLR value calculation of the first embodiment. A part of a threshold distribution of the cell transistors (selected cell transistors) MT in the selected cell unit CU and a used read voltage are shown.

In step S15, LLR values using a plurality of read data obtained in the previous loops only need to be calculated each time the above loop is repeated, and the present embodiment is not limited to the following example.

Each of FIGS. 7 to 9 shows a threshold voltage distribution curve of memory cell transistors MT. As described with reference to FIG. 3, the threshold voltages of the memory cell transistors MT are preferably distributed in different states separated from each other. However, due to various factors after programming, threshold voltage distributions of adjacent states may overlap with each other. FIGS. 7 to 9 show such states.

FIG. 7 shows an example of calculation of LLR values in the initial loop. That is, in the case of FIG. 7, only the read R1 has been performed and only the read data RD1 has been obtained.

FIG. 8 shows an example of the LLR value calculation in the second loop. That is, in the case of FIG. 8, the read R1 and SR2 have been performed and the read data RD1 and RD2 have been obtained.

FIG. 9 shows an example of the LLR value calculation in the third loop. That is, in the case of FIG. 9, the read R1, SR2, and SR3 have been performed and the read data RD1, RD2, and RD3 have been obtained.

Figure 10:
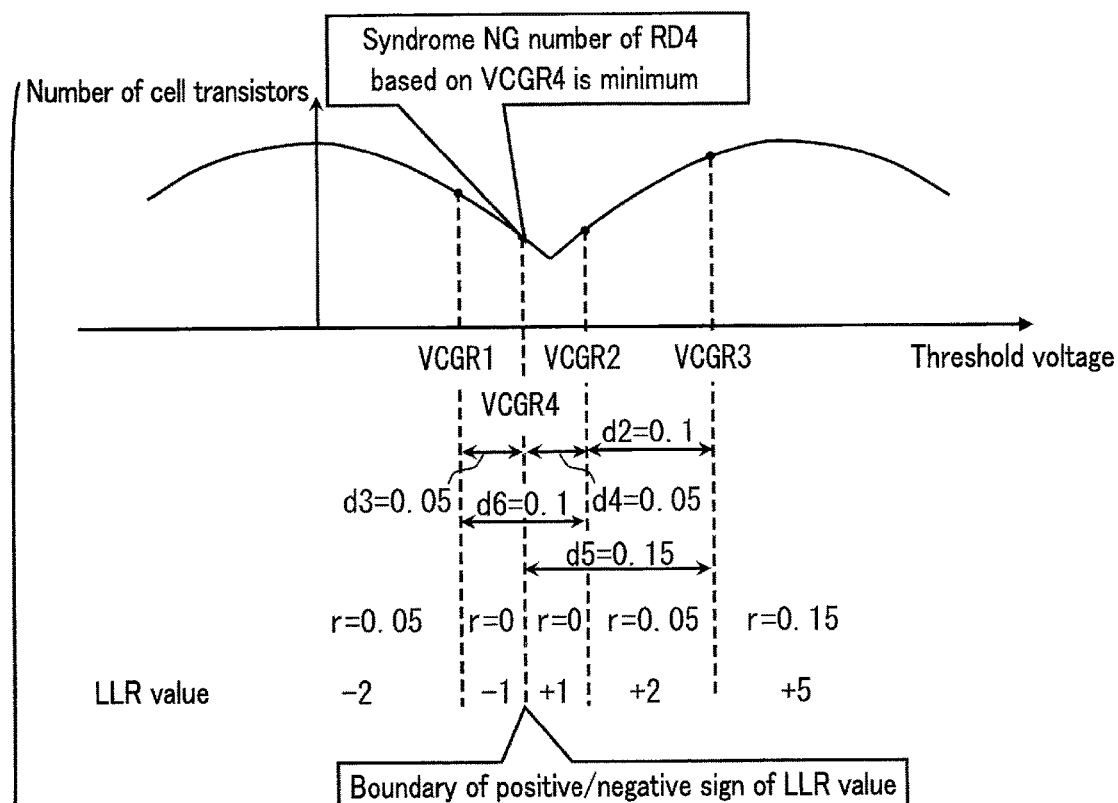
FIG. 10 shows the details of an example of LLR value calculation according to the first embodiment.

FIG. 10 shows an example of the LLR value calculation in the fourth loop. That is, in the case of FIG. 10, the read R1, SR2, SR3, and SR4 have been performed and the read data RD1, RD2, RD3, and RD4 have been obtained.

As shown in FIG. 7, only the read R1 has been executed using the read voltage VCGR1. Based on only one read having been performed, the LLR value of a constant value, for example, three is allocated to one-bit data from each selected cell transistor MT having a threshold voltage Vth equal to or higher than the voltage VCGR1 in the read data RD1. On the other hand, for example, the LLR value of a value with the sign opposite to the sign of the LLR value allocated to one-bit data from each selected cell transistor MT having the threshold voltage Vth equal to or higher than the voltage VCGR1, that is, three is allocated to one bit data from each selected cell transistor MT having the threshold voltage Vth lower than the voltage VCGR1 in the read data RD1.

As shown in FIG. 8, in addition to the read using the read voltage VCGR1, the read SR2 has been further performed using the read voltage VCGR2. The read voltage VCGR2 is higher than the read voltage VCGR1. A difference d1 between the read voltages VCGR1 and VCGR2 is, for example, 0.1 V.

First, the error correction controller 271 determines which of the read voltages VCGR1 and VCGR2 will be used for the boundary of the sign of the LLR value, based on any reference. As an example, which of the read data obtained using the read voltage VCGR1 (that is, the initial read data RD1) and the read data obtained using the read voltage VCGR2 (that is, the shift read data RD2) includes fewer error bits can be used as a reference. As an example of a method performed for such a purpose, the error correction controller 271 compares the syndrome NG number of the read data RD1 calculated in step S4 and the syndrome NG number of the read data RD2 calculated in step S14 in the second loop. The error correction controller 271 uses the read voltage VCGR used to obtain the read data from which the smaller syndrome NG number is calculated as the boundary of the sign of the LLR value. A voltage corresponding to such a boundary is hereinafter referred to as a boundary read voltage. In the current example, the count FBC of error bits estimated to be included in the read data RD2 is estimated to be smaller than the count FBC of error bits estimated to be included in the read data RD1. Therefore, the error correction controller 271 determines to use the read voltage VCGR2 as the sign of the boundary of the LLR value.

The determination for which of the read voltages VCGR1 and VCGR2 is used as the boundary read voltage can be based on the count of so-called on-cells. An on-cell is a cell transistor that remains on while a corresponding read voltage is applied to a word line (selected word line) WL coupled to the selected cell unit. CU. The memory controller 2 counts on-cells at each of various read voltages, for example, as part of Vth tracking. From a relation between the threshold voltage Vth of the cell transistor MT and the number of cell transistors MT having that threshold voltage Vth, which is calculated from the number of on-cells obtained at that time, a local minimum value can be used.

Next, the error correction controller 271 calculates LLRmax, which is a maximum absolute value among the LLR values and will be used in the current loop (second loop in the current example). For example, LLRmax can be based on the total read number of initial read and shift read executed at the stage of the current loop and an absolute value of a difference between the boundary read voltage VCGR and the read voltage VCGR farthest from the boundary read voltage VCGR (maximum shift amount) at the stage of the current loop. More specifically, the maximum LLR value can be calculated by the following formula (1). In the formula (1), a variable d represents a maximum shift amount at the stage of the current loop. LLRn(n) is a value determined in advance in association with the number of reads n, and LLRd(d) is a value determined in advance in association with the maximum shift amount d.

$$LLRmax(n,d) = \min\{LLRn(n), LLRd(d)\} \quad (1)$$

As an example, LLRn(n) and LLRd(d) can be determined from the tables shown in FIGS. 11 and 12. As shown in FIG. 11, a read number table shows the value LLRn(n) corresponding to each number of reads n. As shown in FIG. 12, a maximum shift amount table shows LLRd(d) corresponding to the maximum shift amount d. The read number table and the maximum shift amount table are stored in the RAM 23, for example.

Referring back to FIG. 8, based on the current example, the number of reads n is 2 and the maximum shift amount d1 is 0.1. Therefore, the formula (1) derives LLRmax(2,0.1) =min{3,5}=3.

In the current example, the read voltage VCGR1 has a difference the maximum shift amount from the boundary read voltage VCGR2, the read voltage VCGR1 is lower than the boundary read voltage VCGR2, and the read voltage VCGR2 is the boundary of the sign of the LLR value as described above. Therefore, the error correction controller 271 decides to use data obtained by read parformed with the boundary read voltage VCGR2, that is, the read data RD2 as hard bits. In addition, the error correction controller 271 allocates −3, which is a combination of negative sign and the calculated LLRmax=3, to one-bit data in the read data RD2 from each selected cell transistor MT having the threshold voltage Vth lower than the read voltage VCGR1.

Next, the error correction controller 271 calculates the LLR values for the bits of the selected cell transistors having the threshold voltage Vth belonging to the remaining ranges. The ranges over which the LLR values are to be calculated can be selected in any order. As an example, the LLR value for VCGR1≤Vth<VCGR2 is first calculated. The calculation can be performed by interpolation using LLRmax and the read voltage VCGR2. As a more specific example, the error correction controller 271 calculates another LLR value using a formula (2). In the formula (2), a variable r represents an absolute value of a difference between a certain read voltage VCGR (in the current example, the read voltage VCGR2) and the boundary read voltage VCGR.

$$LLRA(r) = \text{floor}(r/d \times LLRmax + 0.5) \quad (2)$$

However, when LLRA(r)=0 is calculated, LLR(r) is replaced by 1.

Based on the current example, the formula (2) derives LLRA(0)=floor(0/0.1×3+0.5)=floor(0.5)=0. Therefore, the error correction controller 271 decides to use LLRA(0)=1. The read voltage VCGR2 is the boundary of the sign of the LLR value, so that the error correction controller 271 allocates −1, which is a negative value of LLRA(=1) obtained in the read data RD2, to one-bit data from each selected cell transistor MT having the threshold voltage Vth of VCGR1 Vth <VCGR2.

Similarly, the error correction controller 271 calculates the LLR value for VCGR2≤Vth. From the formula (2), the error correction controller 271 derives LLRA(0)=floor(0/0.1×3+0.5)=floor(0.5)=0. Therefore, in the read data RD2, the error correction controller 271 allocates LLRA(0)=1 to one-bit data from each selected cell transistor MT having the threshold voltage Vth of VCGR2≤Vth.

As shown in FIG. 9, in addition to read using the read voltages VCGR1 and VCGR2, the shift read SR3 has been further executed using the read voltage VCGR3. The read voltage VCGR3 is higher than the read voltage VCGR2. A difference d2 between the read voltages VCGR2 and VCGR3 is, for example, 0.1 V.

First, the error correction controller 271 determines which of the read voltages VCGR1, VCGR2, and VCGR3 will be used as the boundary read voltage. As an example, as described above with reference to FIG. 8, the error correction controller 271 decides to use the read voltage VCGR2 as the boundary read voltage, based on the syndrome NG numbers. In addition, the error correction controller 271 decides to use the read data RD2 obtained by read based on the boundary read voltage VCGR2 as hard bits.

Next, the error correction controller 271 calculates the maximum value LLRmax of the LLR value to be used in the current loop (third loop in the current example). As an example, LLRmax is calculated from the formula (1) as described above with reference to FIG. 8. Based on the example of FIG. 9, the number of reads n=3 and the maximum shift amount d=d1=d2=0.1 are obtained, so that the error correction controller 271 derives LLRmax(3,0.1) =min{3,5}=3 using the formula (1), the read number table, and the maximum shift amount table. The error correction controller 271 allocates the calculated LLRmax(=3) to one-bit data in the read data RD2 from each selected cell transistor MT having the threshold voltage Vth equal to or higher than the read voltage VCGR distant from the boundary read voltage VCGR2 by the maximum shift amount, that is, the read voltage VCGR3. −3, which is the negative value of the calculated LLRmax(=3), may be allocated to one-bit data from each selected cell transistor MT having the threshold voltage Vth lower than the read voltage VCGR1.

Next, in the same way as described with reference to FIG. 8, the error correction controller 271 calculates LLR values for the remaining threshold voltage ranges. The calculation result is as follows.

For the range of VCGR2≤Vth<VCGR3, the number of reads n=3, the maximum shift amount d=0.1, and the absolute value of the difference r=0 are obtained. As a result, the formula (2) derives LLR(0)=floor(0/0.1×3+0.5)= floor(0.5)=0. Therefore, the error correction controller 271 allocates an LLR value of +1 to one-bit data in the read data RD2 from each selected cell transistor MT having the threshold voltage Vth of VCGR2 Vth <VCGR3.

For the range of VCGR1 Vth <VCGR2, the number of reads n=3, the maximum shift amount d=0.1, and the absolute value of the difference r=0 are obtained. As a result, the formula (2) derives LLR(0)=floor(0/0.1×3+0.5)=floor(0.5) =0. Therefore, the error correction controller 271 allocates the LLR value of −1 to one-bit data in the read data RD2 from each selected cell transistor MT having the threshold voltage Vth of VCGR1 Vth<VCGR2.

For the range of Vth <VCGR1, the number of reads n=3, the maximum shift amount d=0.1, and the absolute value of the difference r=0.1 are obtained. As a result, the formula (2) derives LLR(0.1)=floor(0.1/0.1×3+0.5)=floor(3.5)=3. Therefore, the error correction controller 271 allocates the LLR value of −3 to one-bit data in the read data RD2 from each selected cell transistor MT having the threshold voltage Vth of Vth<VCGR1.

As shown in FIG. 10, in addition to the read using the read voltages VCGR1, VCGR2, and VCGR3, the shift read SR4 has been further executed using the read voltage VCGR4. The read voltage VCGR4 is higher than the read voltage VCGR1 and is lower than the read voltage VCGR2. A difference d3 between the read voltages VCGR1 and VCGR4 is, for example, 0.05 V and a difference d4 between the read voltages VCGR2 and VCGR4 is, for example, 0.05 V.

As an example, the error correction controller 271 decides to use the read voltage VCGR4 as a boundary of the sign of the LLR value and to use the read data RD4 obtained by the read with the boundary read voltage VCGR4 as hard bits. Next, the error correction controller 271 calculates the maximum value LLRmax of the LLR value to be used in the current loop (fourth loop in the current example). Based or the example of FIG. 9, the number of reads n=4 and the maximum shift amount d=d5=d2+d4=0.15 are obtained, so that the formula (1) derives LLRmax(4, 0.15)=min{5,6}=5. Therefore, the error correction controller 271 allocates the calculated LLRmax(=5) to one-bit data in the read data RD4 from each selected cell transistor MT having the threshold voltage Vth equal to or higher than the maximum read voltage VCGR3.

Next, in the same way as described with reference to FIG. 8, the error correction controller 271 calculates LLR values for the remaining threshold voltage ranges. The calculation result is as follows.

For the range of VCGR2≤Vth <VCGR3, the number of reads n=4, the maximum shift amount d=0.15, and the absolute value of the difference r=0.05 are obtained. As a result, the formula (2) derives LLR(0.05)=floor(0.05/0.15× 5+0.5)=floor(2.17)=2. Therefore, the error correction controller 271 allocates an LLR value of +2 to one-bit data in the read data RD4 from each selected cell transistor MT having the threshold voltage Vth of VCGR2≤Vth<VCGR3.

For the range of VCGR4≤Vth<VCGR2, the number of reads n=4, the maximum shift amount d=0.15, and the absolute value of the difference r=0 are obtained. As a result, the formula (2) derives LLR(0)=floor(0/0.15×5+0.5)=floor (0.5)=0. Therefore, the error correction controller 271 allocates an LLR value of +1 to one-bit data in the read data RD4 from each selected cell transistor MT having the threshold voltage Vth of VCGR4≤Vth<VCGR2.

For the range of VCGR1≤Vth<VCGR4, the number of reads n=4, the maximum shift amount d=0.15, and the absolute value of the difference r=0 are obtained. As a result, the formula (2) derives LLR(0)=floor(0/0.15×5+0.5)=floor (0.5)=0. Therefore, the error correction controller 271 allocates an LLR value of −1 to one-bit data in the read data RD4 from each selected cell transistor MT having the threshold voltage Vth of VCGR1≤Vth<VCGR4.

For the range of Vth<VCGR1, the number of reads n=4, the maximum shift amount d=0.15, and the absolute value of the difference r=0.05 are obtained. As a result, the formula (2) derives LLR(0.05)=floor(0.05/0.15×5+0.5)=floor(2.17) =2. Therefore, the error correction controller 271 allocates the LLR value of −2 to one-bit data in the read data RD4 from each selected cell transistor MT having the threshold voltage Vth of Vth<VCGR1.

As can be seen from FIGS. 7 to 10, execution of more loops generates a more detailed set of LLR values. That is, more ranges of the LLR values are obtained and more kinds of LLR values are obtained, which leads to obtaining a more detailed likelihood for data of each bit in the read target data. Therefore, a more detailed set of LLR values is obtained, so that the SB decoding may succeed as the loop is repeated.

<2.2 Application to Multi-Value Storage (Storage of Two Bits or More Per Cell Transistor)>

For example, in the case of lower page read, the read described with reference to FIGS. 6 to 12 is applied to A read and ER read and the obtained data is logically operated, which generates the lower page data. That is, the memory controller 2 first uses the read voltage VA as the read voltage VCGR1 in step S2 to obtain error-corrected read data (A read data). Next, the memory controller 2 uses the read voltage VE as the read voltage VCGR1 in step S2 to obtain the error-corrected read data (E read data). Further, the memory controller 2 performs a logical operation on all sets of bits at the same positions of the A read data and the E read data. A set of bits resulting from the logical operation corresponds to the lower page data. A bit having a value 1 in both the A read data and the E read data has a value 1 in the lower page data. A bit having a value 0 in the A read data and having a value 1 in the E read data has a value 0 in the lower page data. A bit having a value 0 in both the A read data and the E read data has a value 1 in the lower page data. The same applies to middle page read and upper page read.

<3. Advantages (Effects)>

According to the first embodiment, there is the high possibility that the SB decoding will succeed quickly as described below.

FIG. 13 schematically shows a flow of processing in the data read and the SB decoding, shows a flow of processing in an example for reference in a part (a), and shows a flow of processing in the first embodiment in a part (b). FIG. 13 configures a part of read of data stored in one page of the selected cell unit CU and shows a course from the initial read from one page of the selected cell unit CU to the SB decoding.

In the reference example, as shown in the part (a), a plurality of shift reads are required for execution of the SB decoding before the SB decoding of the data (initial read data) read by the initial read can be started. That is, the memory controller can start the SB decoding of the initial read data only after completion of the predetermined shift reads of the predetermined number. The necessary number of shift reads is previously determined in advance based on various factors and the part (a) of FIG. 13 shows an example where seven shift reads (shift read 1 to shift read 7) are necessary.

A reason why the predetermined number of shift reads are necessary is that it is necessary to derive a kind of values (labels) for each bit of the initial read data and convert the labels into LLR values necessary for the SB decoding. That is, the conversion from the labels into the LLR values is performed by a prepared conversion table (LLR table), so that acquisition of the LLR values requires acquisition of the labels. The labels are, in turn, obtained only after completion of a plurality of shift reads, which requires the predetermined number of shift reads at the start of the SB decoding.

To obtain the LLR values, the memory controller according to the first embodiment calculates the LLR values from the read data using the value determined in advance in association with the number of reads n, the value determined in advance in association with the maximum shift amount d, and the absolute value of the difference between the read voltage VCGR and the boundary read voltage. In the present specification and claims, "calculation" does not include determining another value from one value using a one-to-one relation such as the LLR table. Therefore, the memory controller according to the first embodiment "calculates" the LLR value without using the LLR table. For this reason, as shown in the part (b) of FIG. 13, every time read is performed, the LLR values can be obtained and the SB decoding can be started by the obtained LLR values. As the number of reads (in particular, shift reads) increases, the detailed LLR values can be obtained. Although accuracy of the LLR values is low in the first several shift reads, there is the possibility of starting the SB decoding without waiting for completion of the necessary number of shift reads as in the reference example. Therefore, if the SB decoding succeeds at the stage of the small number of loops, the SB decoding can be completed more quickly than in the reference example.

In addition, according to the first embodiment, it is not necessary to store a large number of LLR tables as described below.

Generally, in a semiconductor memory, it is difficult for data to be read using a negative read voltage and in the case where a threshold voltage distribution is in a negative region of the threshold voltage, a shift read in the negative region may be inexecutable. In this case and the case where LLR labels based on the predetermined number (for example, seven) of shift reads are necessary as in the reference example, the LLR label cannot be obtained, so that an LLR table generated based on the predetermined number of shift reads cannot be used. In preparation for such a case, the memory controller stores an LLR table for LLR labels obtained through some unexecuted shift reads. As described so far, the SB decoding which requires the predetermined number of shift reads for acquiring the LLR label requires various LLR tables.

The memory controller 2 according to the first embodiment can calculate the LLR values. For this reason, the LLR values for cell transistors MT having a negative threshold voltage can be obtained and the LLR table is unnecessary in the first place. Therefore, the amount of data required by the memory controller is smaller than the amount of data required by the memory controller according to the reference example.

In addition, according to the first embodiment, data read from the semiconductor memory 1 for a purpose different from the SB decoding can be used for the SB decoding as described below.

Figure 14:
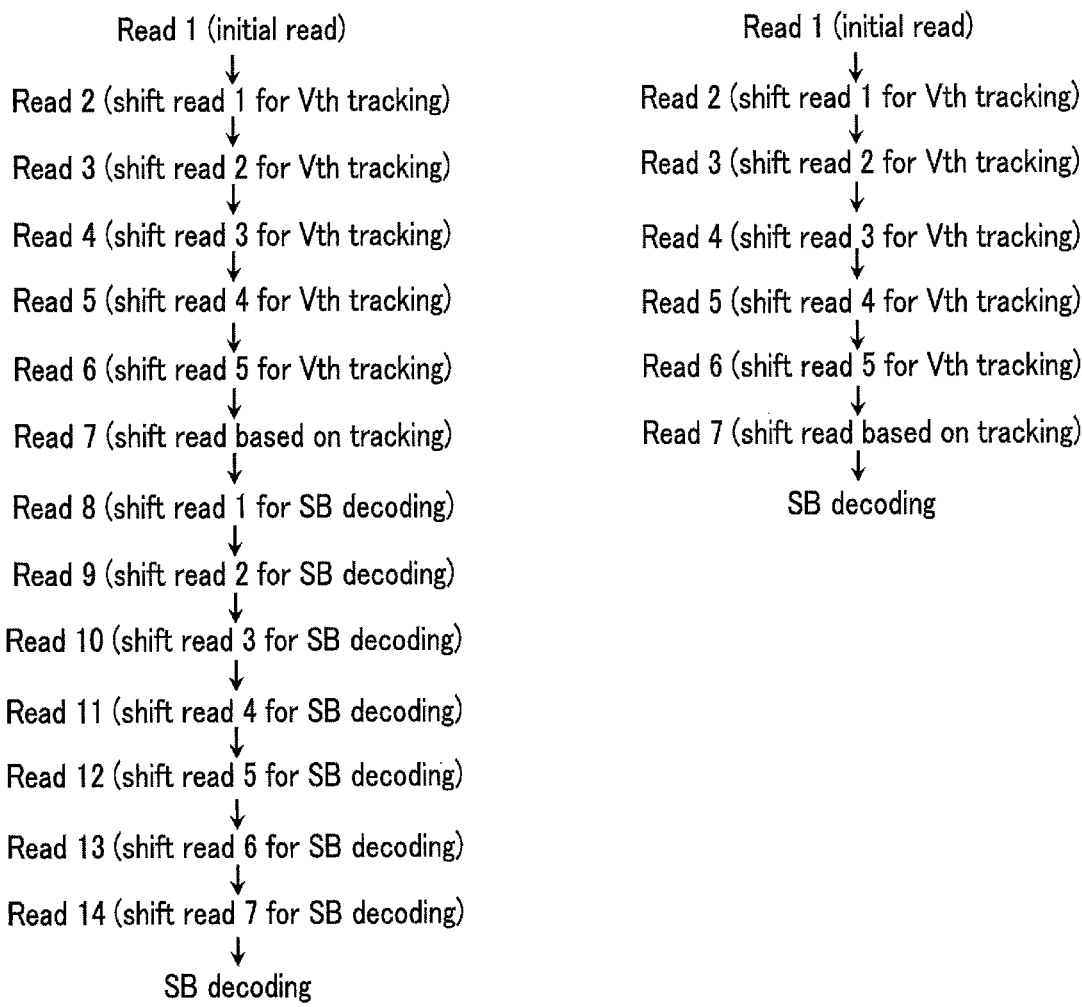
FIG. 14 schematically shows a flow of processing in data read and SB decoding in an example for reference and the first embodiment.

FIG. 14 schematically shows a flow of processing in the data read and the SB decoding, shows a flow of processing in an example for reference in a part (a), and shows a flow of processing in the first embodiment in a part (b). Similar to FIG. 13, FIG. 14 configures a part of read of data stored in a read-target page, configures a part of read of data stored in one page of a selected cell unit CU, and shows a course from the initial read from one page of the selected cell unit CU to SB decoding.

As shown in the part (a) of FIG. 14, Vth tracking is performed after the initial read. As shown in FIG. 15, the threshold voltage distribution can change from a state (upper section in FIG. 15) immediately after programming to another state (lower section in FIG. 15). In a state after the change, use of a read voltage VAopt corresponding to a local minimum position of the threshold voltage distribution can lead to better read (higher error correction success rate) than the read using the default read voltage VA. Based on this, the memory controller 2 can perform Vth tracking to determine the local minimum position of the threshold voltage distribution. The Vth tracking includes a plurality of shift reads at a plurality of read voltages different from the read voltage VCGR in the initial read and estimation of a voltage of the local minimum position based on a result of the shift read (for example, the read voltage VAopt). In the example of FIG. 14, five shift reads are performed for the Vth tracking.

The SB decoding starts when the HB decoding fails even in read using the local minimum position voltage VAopt estimated by the Vth tracking read as the read voltage. As described with reference to the part (a) of FIG. 13, the predetermined number of (for example, seven) shift reads are necessary for the SB decoding.

The shift reads for the Vth tracking and the shift reads for the SB decoding are essentially the same. However, because the purposes are different, the read voltages specified at the shift reads for the Vth tracking do not correspond to the read voltages specified at the shift reads for the SB decoding. This is because intervals of the read voltages are different, heights of the read voltages are different, and/or the numbers of necessary read voltages are different, due to a purpose difference. For this reason, as shown in the part (a) of FIG. 14, the shift reads for the SB decoding are additionally necessary after the predetermined number of Vth tracking reads.

According to the first embodiment, the LLR values are calculated. For this reason, the LLR values can be calculated based on the read data obtained by the Vth tracking reads. Therefore, as shown in the part (b) of FIG. 14, after the shift reads for the Vth tracking purpose, the shift reads for the SB decoding do not need to be performed for the SB decoding as shown in the part (a) of FIG. 14. Therefore, the SB decoding can be completed in a shorter time than the example of the part (a) of FIG. 14.

Figure 16:
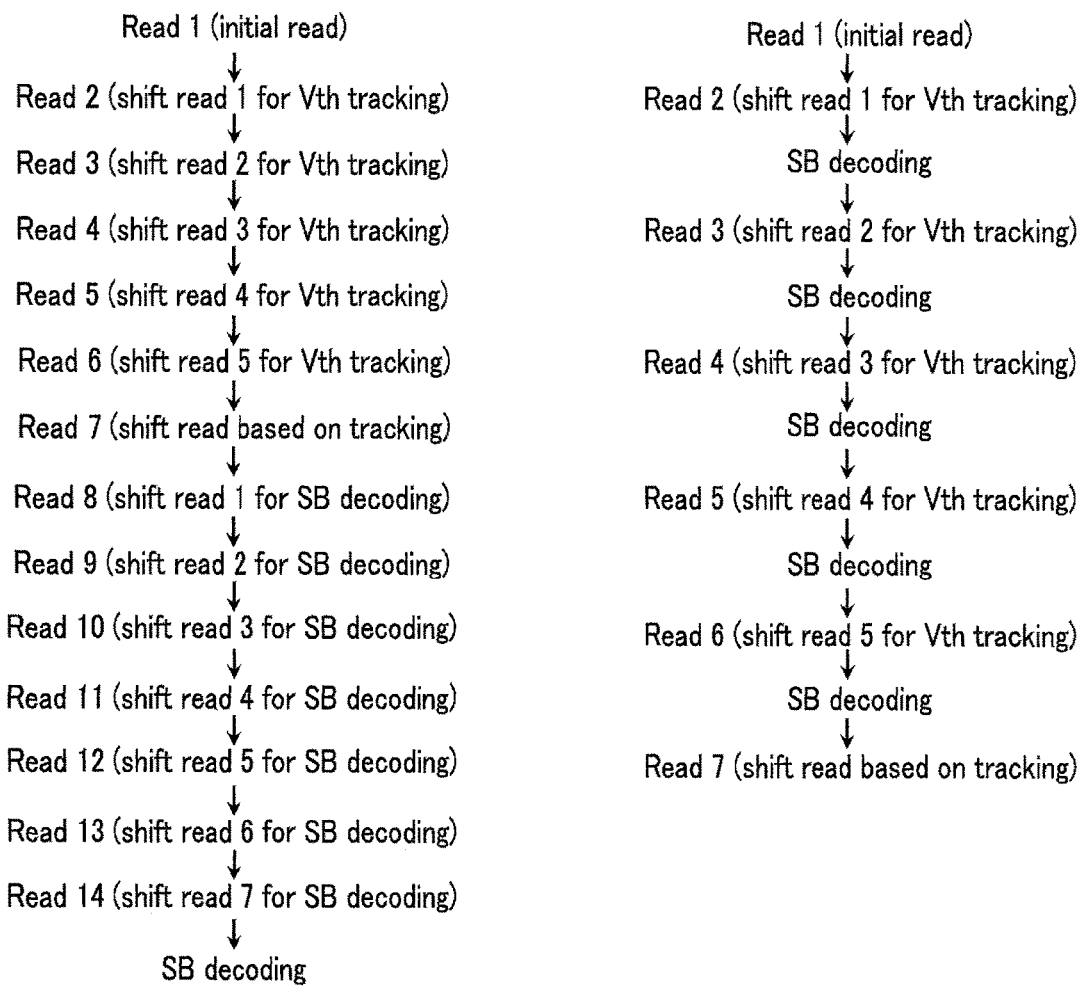
FIG. 16 schematically shows a flow of processing in SB decoding on read data in an example for reference and the first embodiment.

Furthermore, as shown in FIG. 16, the Vth tracking and the SB decoding can be performed in parallel. That is, according to the first embodiment, the shift amount of the read voltage VCGR to obtain the LLR values can be set to any amount. For this reason, each time the read data is obtained by the shift read for the purpose of Vth tracking, the LLR values are calculated and the SB decoding can be performed. Therefore, there is a possibility that the SB decoding succeeds more quickly than the case of the part (b) of FIG. 13 and even before the Vth tracking is completed in some cases.

In addition, according to the first embodiment, the boundary read voltage (hard bit) can be estimated in parallel with the SB decoding. The estimation of hard bit is generally performed during the Vth tracking before the SB decoding. On the other hand, as in the first embodiment, the estimation of the hard bit and the SB decoding are performed in parallel, so that error correction can be efficiently performed.

In addition, according to the first embodiment, there is a possibility that the SB decoding succeeds quickly even in the case described below.

In each shift read to obtain the LLR label, a read voltage shifted by a predetermined magnitude from the read voltage used in the initial read should be used. This is because the LLR table requires LLR labels obtained by a predetermined method and acquisition of the LLR labels requires shift read at a read voltage of a predetermined magnitude. However, if read voltages having predetermined differences are used, the SB decoding may not be successfully performed.

Figure 17:
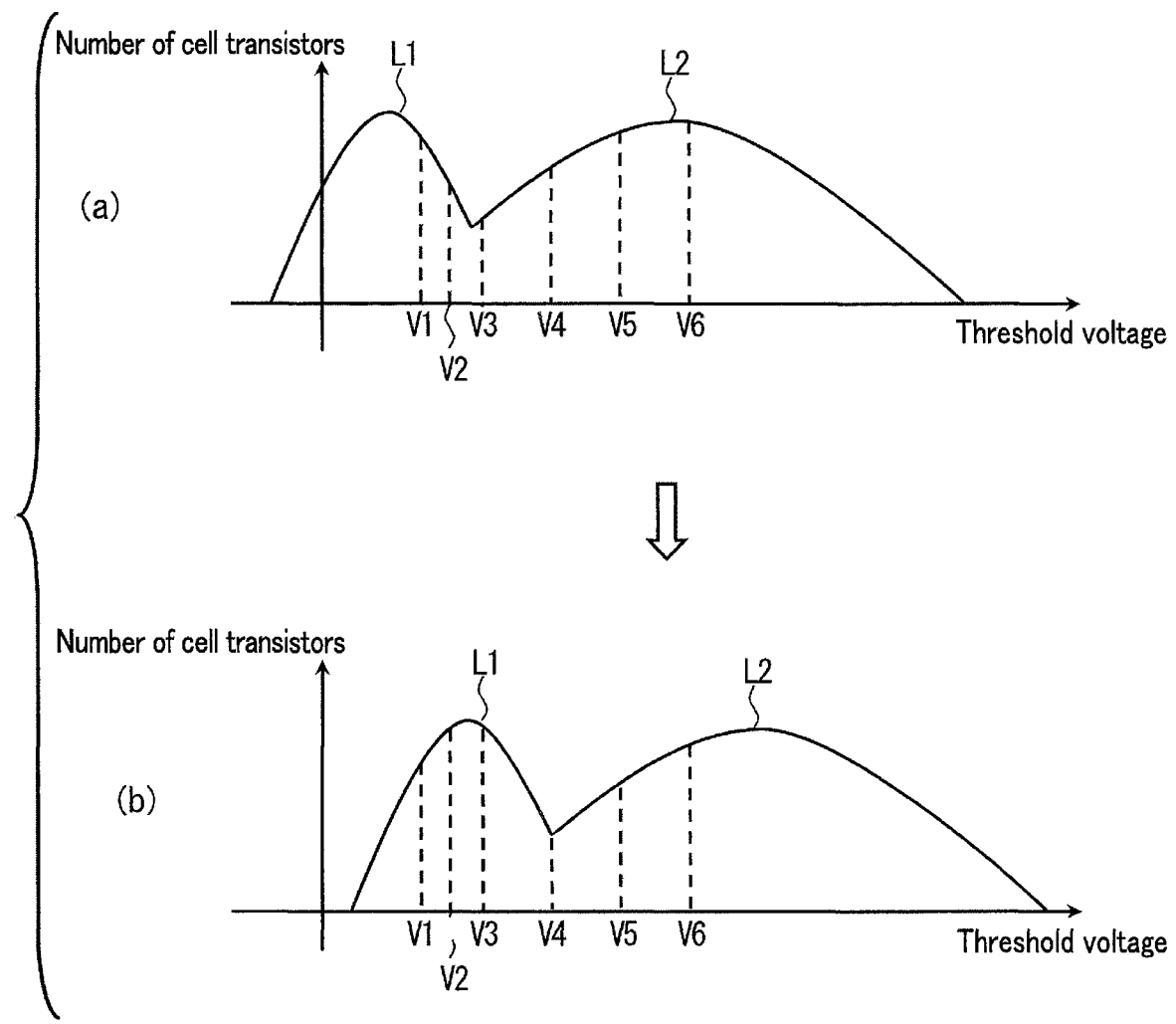
FIG. 17 shows a threshold voltage distribution curve and read voltages in an example for reference.

For example, as shown in the part (a) of FIG. 17, when shapes of two adjacent threshold voltage distributions are largely different, read voltages of non-uniform intervals may be used and the LLR table generated on the assumption that such read voltages are used may be used. That is, in a curve L1 having a larger inclination in two convex curves L1 and L2, each range over which the LLR value is determined is preferably narrow, so that an interval of read voltages V1, V2, and V3 in the curve L1 is narrow. On the other hand, an interval of read voltages V3, V4, V5, and V6 in the convex curve L2 having a smaller inclination is wide. The read voltages V1 to V6 need to be used and an LLR value in each range between two adjacent read voltages among the read voltages V1 to V6 is determined using the LLR table.

It is assumed that the entire threshold voltage distribution in the part (a) of FIG. 17 has moved to a higher threshold voltage as shown in the part (b) of FIG. 17, due to a passage of time and/or disturbance. In this case, with the read voltages V1 to V6 that need to be used, the LLR values cannot be determined in desired narrow ranges. For example, the read voltage V4 is located in the vicinity of a local minimum point and the read voltage V4 has a wide interval with the adjacent read voltage V3. Therefore, even though the LLR value being obtained for a narrow range in the left convex curve L1 and near the local minimum point tends to lead to the success of the SB decoding, an LLR value for a narrow range in such a place cannot be obtained.

According to the first embodiment, because the LLR values are calculated, a restriction due to the use of the LLR table is not imposed on the read voltages to be used, as described with reference to FIG. 17. Therefore, the voltage range to which each LLR value is allocated can be arbitrarily and flexibly selected, which leads to a higher success rate of the SB decoding.

Second Embodiment

A second embodiment is used in addition to the first embodiment and relates to an example of the details of selection of a read voltage VCGRn in step S12 (see, FIG. 6) of the first embodiment.

A memory system 5 according to the second embodiment has the same components and connections as the memory system 5 according to the first embodiment. On the other hand, a memory controller 2 according to the second embodiment is configured to perform an operation described below. Specifically, a firmware in a ROM 24 is configured to cause the memory controller 2 to perform an operation described below.

FIG. 18 shows a flow of a part of the operation of the memory system 5 according to the second embodiment and shows a sub-flow of step S12 of FIG. 6. Step S11 continues to step S1201. In step S1201, the memory controller 2 determines whether an absolute value |VCGR(n−2)-VCGR(n−1)| of a difference between a read voltage VCGR(n−1) in a previous (n−1)-th loop and a read voltage VCGR(n−2) in a (n−2)-th loop before the (n−1)-th loop is less than a predetermined value. When |VCGR(n−2)-VCGR(n−1)| is the predetermined value or more (No branch), the process proceeds to step S1202. When n is 2, step S1201 continues to step S1202 without proceeding to step S1203.

In step S1202, the memory controller 2 uses gradient descent to determine a read voltage VCGRn estimated to present read data RDn estimated to include an estimated FBC smaller than respective estimated FBCs of read data RD1 to RD(n−1). The gradient descent is a well-known method for optimization and detailed description thereof is unnecessary, so that the detailed description is not given here. Instead, only an outline of the case when the gradient descent is applied to the present embodiment is described below.

Figure 19:
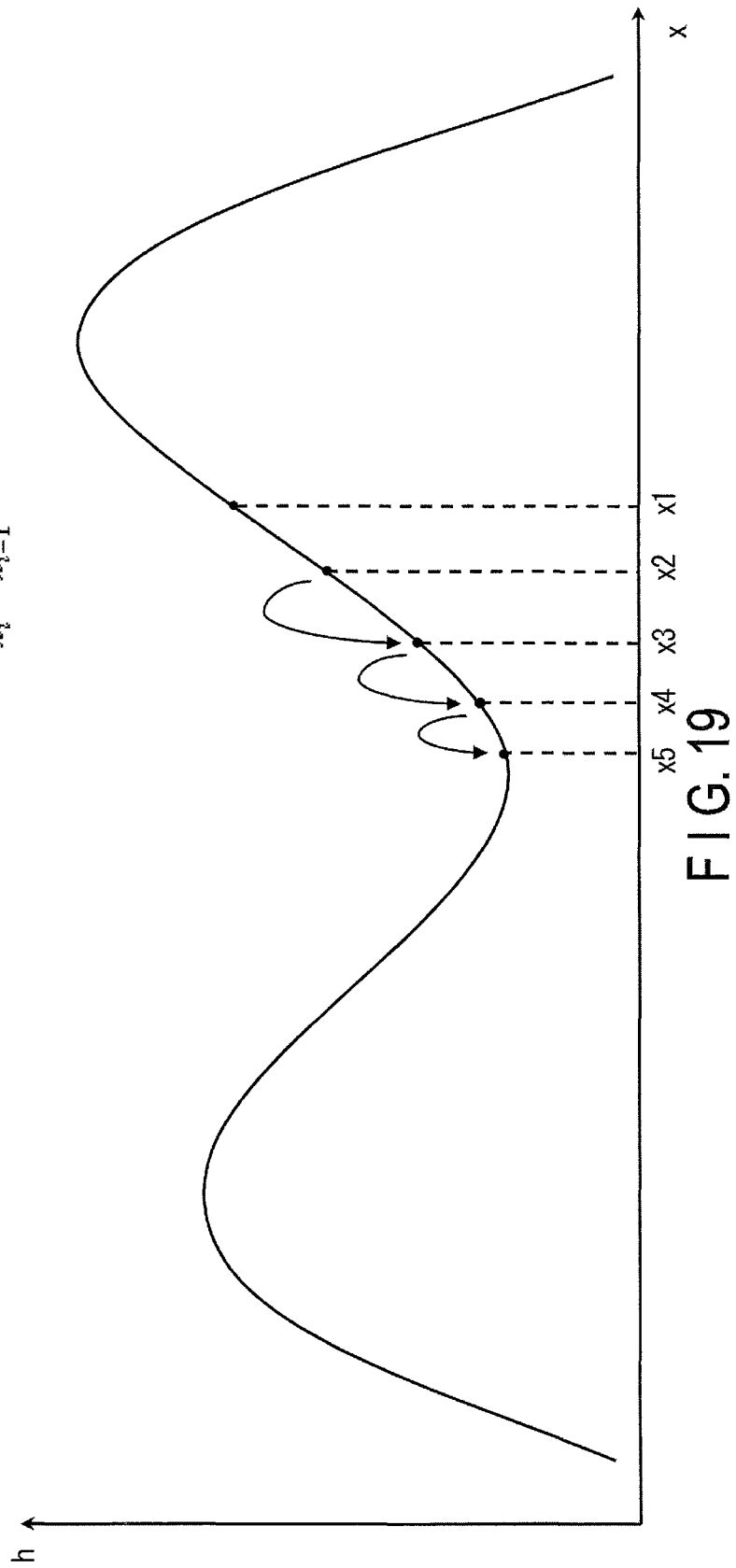
FIG. 19 is a diagram for explaining a method of determining read voltages according to the second embodiment.
Figure 20:
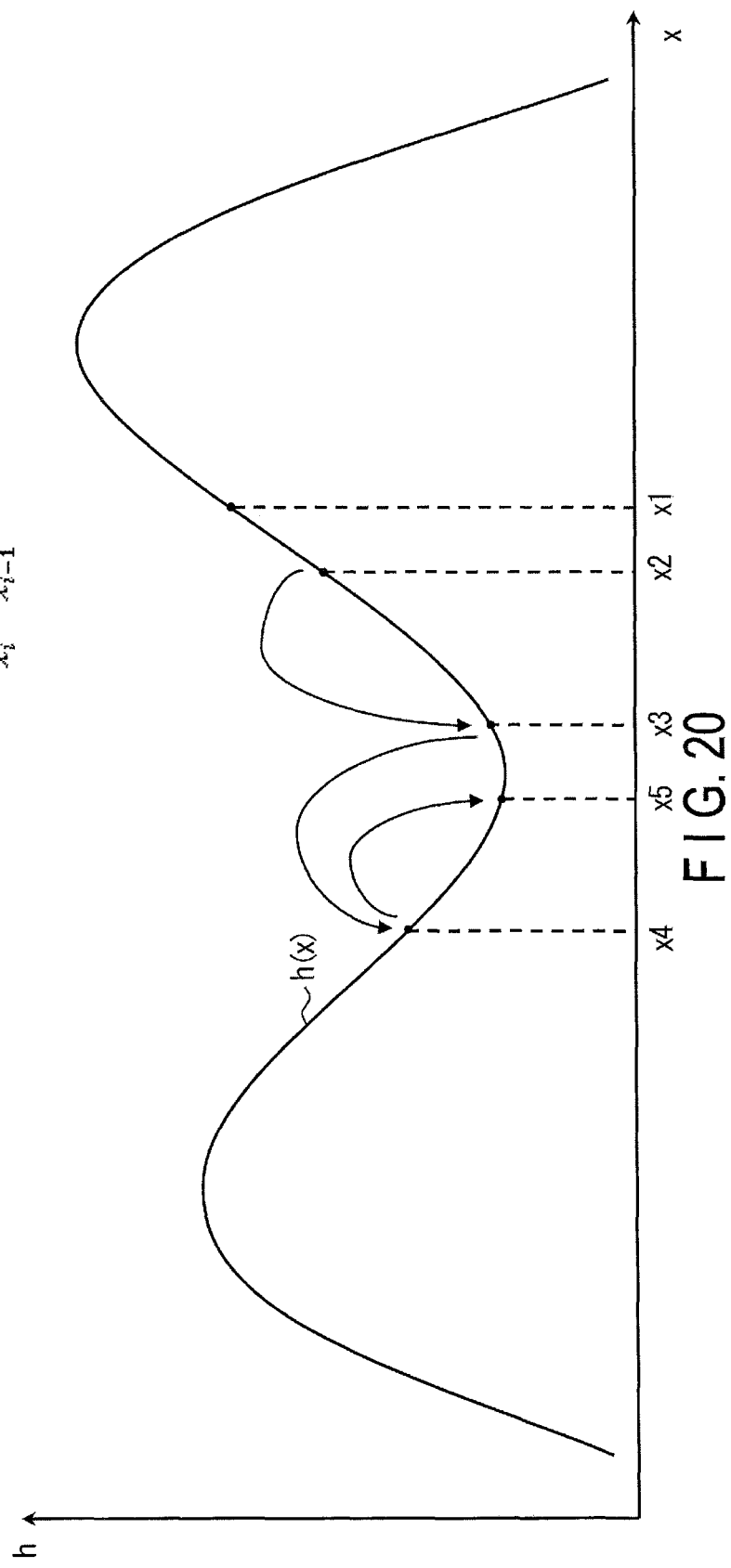
FIG. 20 is a diagram for explaining a method of determining read voltages according to the second embodiment.

In the gradient descent, generally, as shown in FIGS. 19 and 20, $x_{i+1}$ is determined using two variables and $x_i$ and values $h(x_{i-1})$ and $h(x_i)$. A value $h(X)$ can be determined from a value X. In the case of $h(x_i) < h(x_{i-1})$, $x_{i+1} = x_i - A(h(x_i) - h(x_{i-1}))/(x_i - x_{i-1})$ is calculated. A is any positive number. On the other hand, in the case of $h(x_i) > h(x_{i-1})$, $x_{i+1} = -A(h(x_i) - h(x_{i-1}))/(x_i - x_{i-1})$ is calculated. With such calculation is used as one loop and $x_i$ is set as $x_{i-1}$ in the next loop, each time execution of the loop is repeated, $x_i$ that produces smaller $h(x_i)$ can be estimated.

In order for the gradient descent to be used in step S1202, is it assumed that an estimated FBC or an FBC correlation value j (for example, j is a Hamming weight of a syndrome when LDPC is used) with any correlation with the estimated FBC can be obtained by read through a read voltage VCGR. A plurality of FBC correlation values j (VCGR) corresponding to a variety of different read voltages VCGR are then compared, which allows a read voltage VCGRn estimated to present read data RDn estimated to include an estimated FBC smaller than respective estimated FBCs of read data RD1 to RD(n−1) to be determined.

FIG. 19 shows an example of the case where a constant A is small. As shown in FIG. 19, $h(x_1)$, $h(x_2)$, $h(x_3)$, $h(x_4)$, and $h(x_5)$ decreases sequentially in order of $x_1$, $x_2$, $x_3$, $x_4$, and $x_5$ and execution of the loops. As a result of five loops, it is determined that $x_5$ causes minimum $h(x_5)$.

FIG. 20 shows an example of the case where the constant A is large. As shown in FIG. 20, $h(x_4)$ is larger than $h(x_3)$, and therefore $x_5$ larger than $x_4$ is selected. Because $h(x_5)$ is smaller than $h(x_3)$ and $h(x_4)$, it is determined that $x_5$ causes minimum $h(x_5)$.

Based on this method, the memory controller 2 can determine a read voltage VCGR(z+1) (z is a natural number) estimated to lead to a smaller estimated FBC, using two read voltages VCGRz and VCGR(z−1) and FBC correlation values j(VCGRz) and j(VCGR(z−1)). The read voltage VCGRz estimated to lead to the minimum estimated FBC can be the read voltage VCGRz leading to a local minimum FBC correlation value j(VCGRz), for example. In the gradient descent, an optimal solution can be estimated by repeating the loop. However, the memory controller 2 cannot repeat the loop indefinitely. Therefore, in step S1202, the memory controller 2 executes only the predetermined maximum number of loops and it can be determined that a read voltage leading to the minimum estimated FBC at the time of completion of the maximum number of loops is adopted as the read voltage VCGRn.

Figure 21:
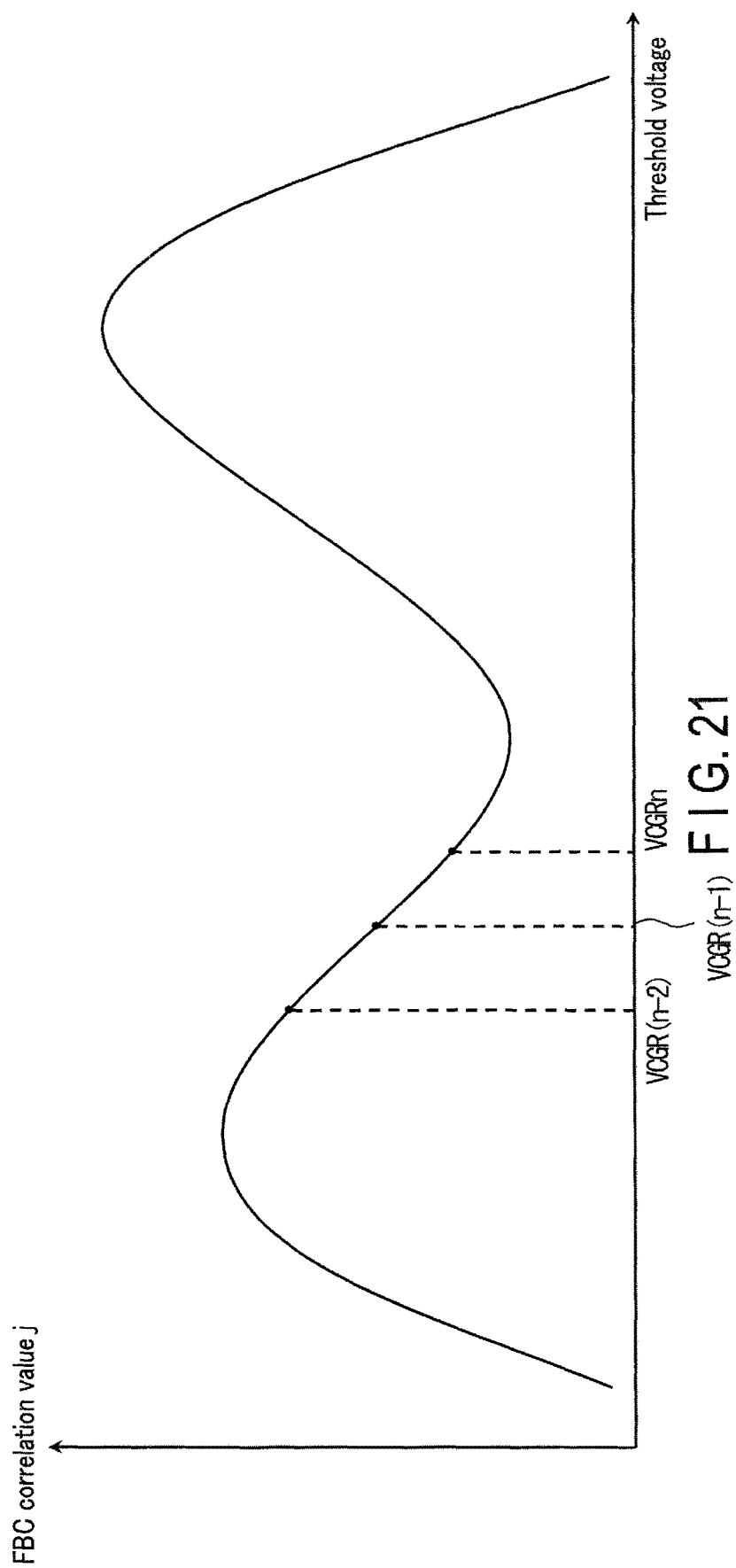
FIG. 21 shows an example of determination of a read voltage according to the second embodiment.

For example, as shown in FIG. 21, the read voltage VCGRn estimated to present a smaller FBC correlation value j(VCGR) can be estimated using the FBC correlation value j(VCGR) and the gradient descent. The read voltage VCGRn is estimated to present the minimum FBC correlation value j(VCGR) in the executed loops of the gradient descent.

Referring back to FIG. 18, step S1202 continues to step S1208. In step S1208, the memory controller 2 instructs the semiconductor memory 1 to perform read with the determined read voltage VCGRn.

When it is determined in step S1201 that an absolute value |VCGR(n−2)-VCGR(n−1)| of a difference is less than a predetermined value (Yes branch), the process proceeds to step S1203. Hereinafter, a read voltage used for reading the read data estimated to have the minimum one of the respective estimated FBCs of the read voltages VCGR1 to VCGR(n−1) is referred to as a read voltage VCGR(m). In addition, in step S1203, the memory controller 2 determines whether any one of the read voltages VCGR1 to VCGR(n−1) is included in a range of VCGR(m)−0.3V ΔV (A is, for example, 0.1 V) to VCGR(m)−0.3V. When none of the read voltages VCGR1 to VCGR(n−1) is not included in the range of VCGR(m)−0.3V−ΔV to VCGR(m)−0.3V (No branch), the process proceeds to step S1204.

In step S1204, the memory controller 2 determines VCGR (m)−0.3V as a read voltage VCGRn. An example of a situation where this processing occurs is shown in FIG. 22.

Figure 22:
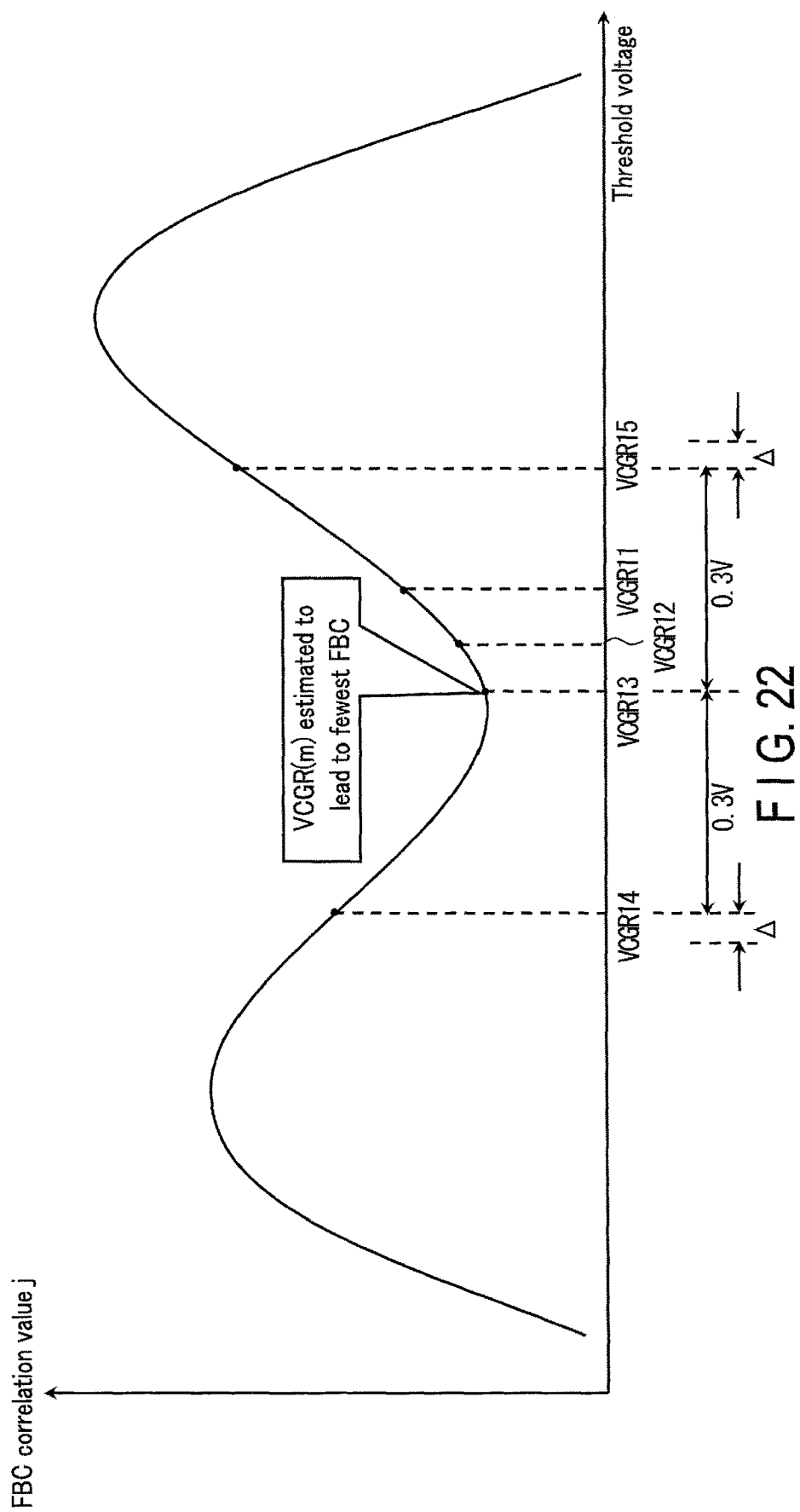
FIG. 22 shows an example of determination of a read voltage according to the second embodiment.

As shown in FIG. 22, prior to the determination of the read voltage VCGRn, read using read voltages VCGR11, VCGR12 (<VCGR11), and VCGR13 (<VCGR12) is already performed. Read data RD13 read using a read voltage VCGR13 has been estimated to have the minimum one of the respective estimated FBCs of the read data RD11, RD12, and RD13. That is, the read voltage VCGR13 corresponds to the read voltage VCGR(m). In addition, none of the read voltages VCGR11, VCGR12, and VCGR13 is included in the range of VCGR(m)−0.3V−ΔV to VCGR(m)−0.3V. Therefore, the memory controller 2 determines a read voltage VCGR14, which is VCGR(m)−0.3V, as the read voltage VCGRn. A read voltage VCGR15 will be described later.

Referring back to FIG. 18, step S1204 continues to step S1208.

In step S1203, when any one of the read voltages VCGR1 to VCGR(n−1) is included in the range of VCGR(m)−0.3−ΔV to VCGR(m)−0.3V (Yes branch), the process proceeds to step S1205. In step S1205, the memory controller 2 determines whether any one of the read voltages VCGR1 to VCGR(n−1) is included in a range of VCGR(m)+0.3V to VCGR(m)+0.3V+ΔV. When none of the read voltages VCGR1 to VCGR(n−1) is included in the range of VCGR(m)+0.3V to VCGR(m)+0.3+ΔV (No branch), the process proceeds to step S1206.

In step S1206, the memory controller 2 determines VCGR(m)+0.3V as the read voltage VCGRn. An example of a situation where this processing occurs is shown in FIG. 22.

As shown in FIG. 22, none of the read voltages VCGR11 to VCGR14 is included in the range of VCGR(m)+0.3V to VCGR(m)+0.3+ΔV. Therefore, the memory controller 2 determines a read voltage VCGR15, which is VCGR(m)+0.3V, as the read voltage VCGRn.

Referring back to FIG. 18, step S1206 continues to step S1208.

In step S1205, when any one of the read voltages VCGR1 to VCGR(n−1) is included in the range of VCGR(m)+0.3V to VCGR(m)+0.3V+ΔV (Yes branch), the process proceeds to step S1207.

In step S1207, the memory controller 2 determines, from among all pairs of adjacent two of the read voltages VCGR1 to VCGR(n−1), any value between most distant two read voltages VCGR as the read voltage VCGRn. For example, the read voltage VCGRn has an intermediate value between the most separated two read voltages VCGR. An example of a situation where this processing occurs is shown in FIG. 23.

Figure 23:
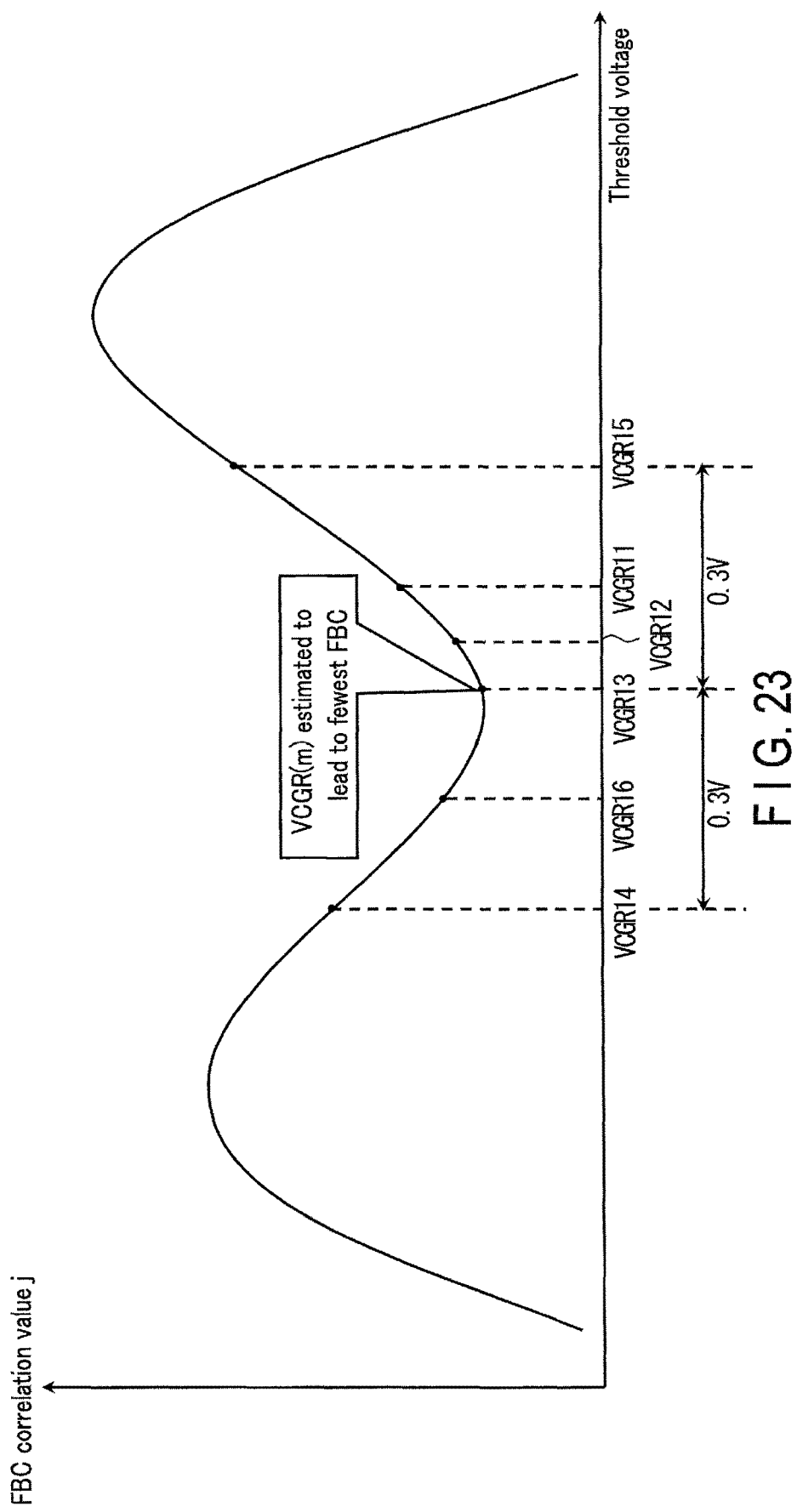
FIG. 23 shows an example of determination of a read voltage according to the second embodiment.

As shown in FIG. 23, the read voltage VCGR14 is VCGR(m)−0.3V, the read voltage VCGR15 is the read voltage VCGR(m)+0.3V, and the read voltages VCGR11 and VCGR12 are read voltages between the read voltage VCGR(m) and the read voltage VCGR15. Therefore, among all pairs of two adjacent read voltages VCGR, an interval between the read voltages VCGR(m) and VCGR14 is largest. Therefore, the memory controller 2 determines a read voltage VCGR16, which lies between the read voltages VCGR(m) and VCGR14, for example, an intermediate value, as the read voltage VCGRn.

Referring back to FIG. 18, step S1207 continues to step S1208.

According to the second embodiment, when the read voltage VCGR leading to the minimum estimated FBC has not yet selected, the read voltage VCGRn is selected by the gradient descent, when the read voltage VCGR leading to the minimum estimated FBC has already been selected, the most distant read voltage VCGRn from the read voltage VCGR leading to the minimum estimated FBC is selected, and when the most distant read voltage VCGR is selected, interpolation is performed between the most distant two adjacent read voltages VCGR. With such selection of the read voltage VCGRn, the read voltage VCGRn can be efficiently selected during the SB decoding according to the first embodiment. This can enhance the advantages according to the first embodiment.

Third Embodiment

A third embodiment relates to an example of calculation of an LLR value and is applied to substitute a part of the first embodiment.

A memory system 5 according to the third embodiment has the same components and connections as the memory system 5 according to the first embodiment. On the other hand, a memory controller 2 according to the third embodiment is configured to perform an operation described below. Specifically, a firmware in a ROM 24 is configured to cause the memory controller 2 to perform an operation described below.

In addition, an operation flow of the memory system 5 according to the third embodiment is the same as that of the first embodiment (see, FIG. 6). On the other hand, the third embodiment is different from the first embodiment in step S15 (i.e., calculation of an LLR value).

Figure 24:
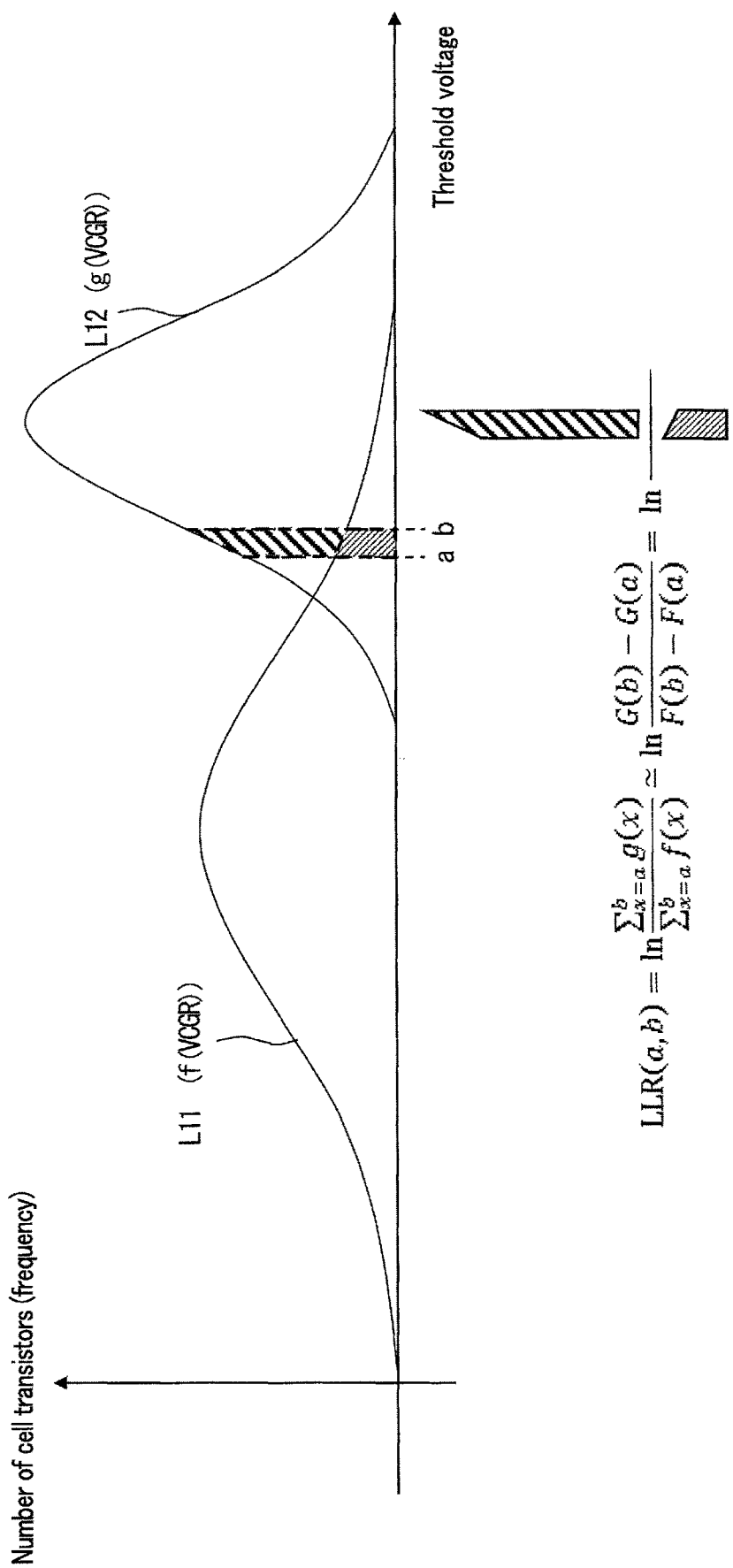
FIG. 24 is a diagram for explaining a method of calculating an LLR value according to a third embodiment.

FIG. 24 shows a concept of a method of calculating a LLR value in the memory system 5 according to the third embodiment. As shown in FIG. 24, it is assumed that a threshold voltage distribution can be approximately represented by two functions f(VCGR) and g(VCGR). A curve L11 is f(VCGR) and a curve L12 is g(VCGR). The functions f(VCGR) and g(VCGR) are obtained by performing programming and read of data in the memory system 5 in advance, or at least before starting the flow of FIG. 6 and/or evaluating the semiconductor memory 1 at a design stage of the memory system 5 by a designer. In addition, the functions f(VCGR) and g(VCGR) are stored in the memory controller 2.

The LLR value calculated by the formula (3) is allocated to a cell transistor MT having a threshold voltage equal to or higher than a read voltage VCGRa and lower than a read voltage VCGRb.

$$LLR(a, b) = \ln \frac{\sum_{x=a}^{b} g(x)}{\sum_{x=a}^{b} f(x)} \simeq \ln \frac{G(b) - G(a)}{F(b) - F(a)} \quad (3)$$

$$\text{where } (x) = \sum_{u=0}^{x} f(u),\ G(x) = \sum_{u=0}^{x} g(u).$$

The memory controller 2 may store functions F(VCGR) and G(VCGR) instead of the functions f(VCGR) and g(VCGR).

Figure 26:
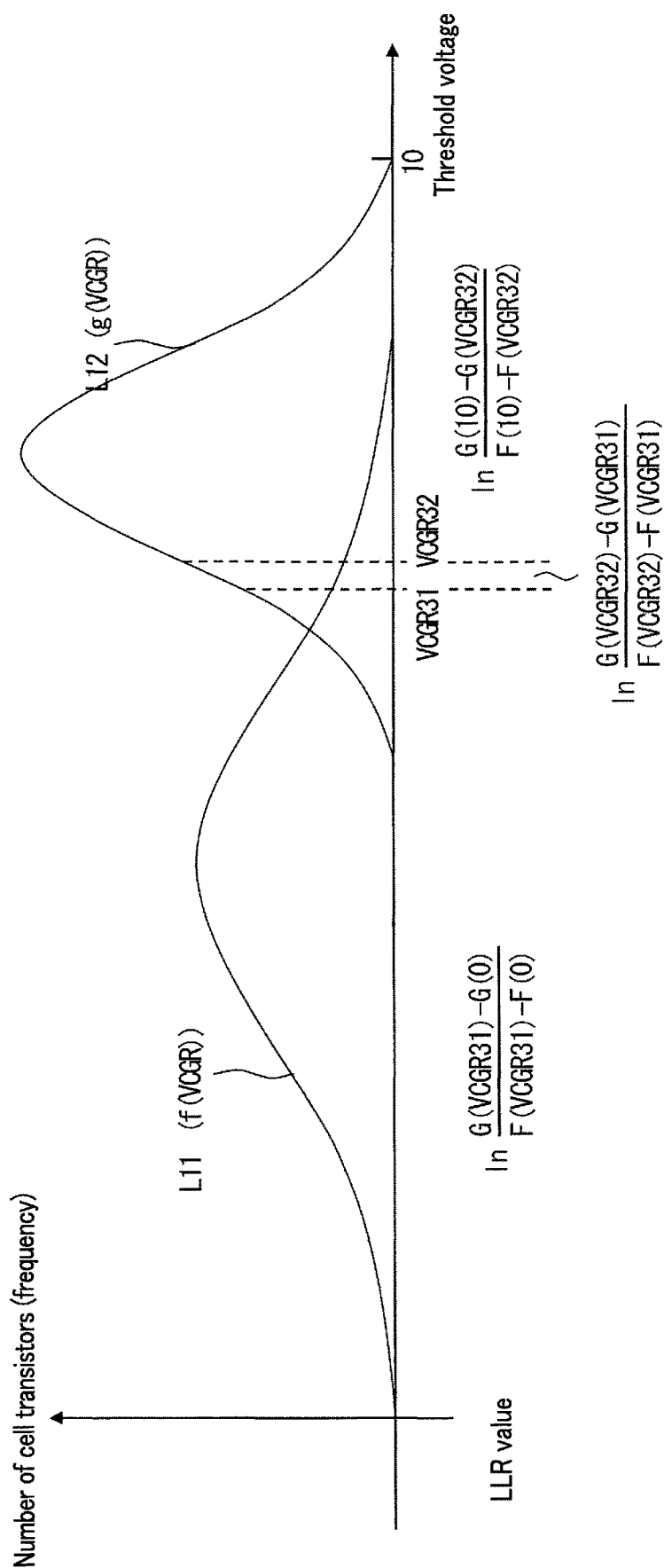
FIG. 26 shows the details of an example of LLR value calculation according to the third embodiment.
Figure 27:
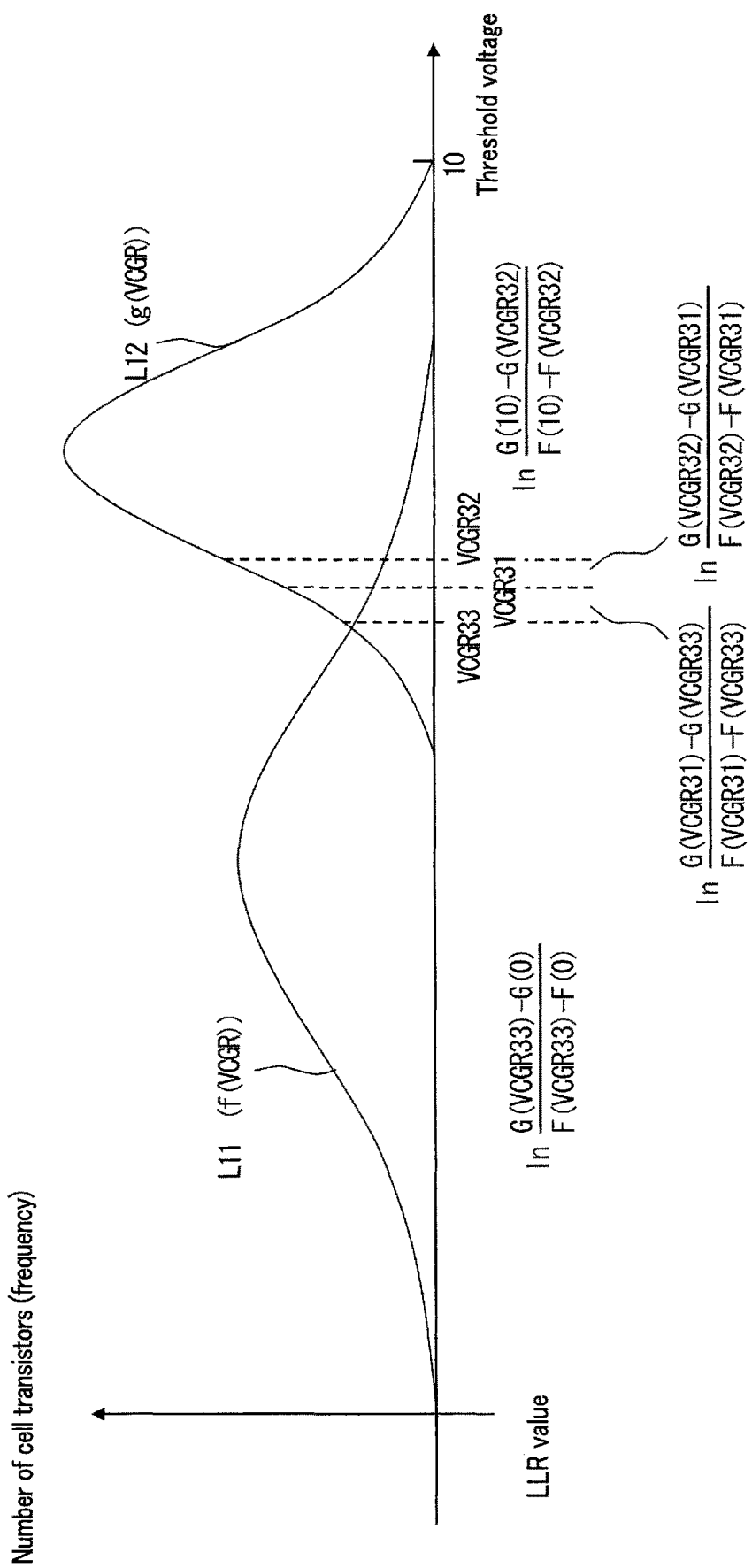
FIG. 27 shows the details of an example of LLR value calculation according to the third embodiment.

The formula (3) is used to calculate the LLR value as follows. FIGS. 25 to 27 show the details of an example of LLR value calculation according to the third embodiment.

FIG. 25 shows calculation of the LLR value in an initial loop (n=1). That is, in the case of FIG. 25, only read using a read voltage VCGR31 has been executed.

FIG. 26 shows calculation of the LLR value in a second loop (n=2). That is, in the case of FIG. 26, only read using read voltages VCGR31 and VCGR32(>VCGR31) has been executed.

FIG. 27 shows calculation of the LLR value in a third loop (n=3). That is, in the case of FIG. 27, only read using read voltages VCGR31, VCGR32, and VCGR33(<VCGR32) has been executed.

In the following calculation, it is assumed that a voltage at a lower boundary of a voltage section including a minimum value is 0V for the purpose of calculating an LLR value for the voltage section including the minimum read voltage VCGR. Likewise, it is assumed that a voltage at a higher boundary of a voltage section including a maximum value is 10V for the purpose of calculating an LLR value for the voltage section including the maximum read voltage VCGR.

As shown in FIG. 25, because only the read voltage VCGR31 is used in the initial loop, an LLR value for a section (equal to or higher than 0V and) lower than VCGR31 and a section equal to or higher than VCGR31 (and lower than 10V) is calculated. From the formula (3), LLR(0,VCGR31)=ln((G(VCGR31)−G(0))/(F(VCGR31) F(0))) is allocated to the cell transistor MT having a threshold voltage Vth lower than VCGR31. Similarly, from the formula (3), LLR(VCGR31,10)=ln((G(10)−G(VCGR31))/(F(10)−F(VCGR31))) is allocated to the cell transistor MT having the threshold voltage Vth equal to or lower than VCGR31.

As shown in FIG. 26, because the read voltages VCGR31 and VCGR32 are used in the second loop, LLR values for a section of lower than VCGR31, a section equal to or higher than VCGR31 and lower than VCGR32, and a section equal to or higher than VCGR32 are calculated. From the formula (3), LLR(0,VCGR31)=ln((G(VCGR31)−G(0))/(F(VCGR31) F(0))) is allocated to the cell transistor MT having a threshold voltage Vth lower than VCGR31. Because the section lower than the VCGR31 is the same as that in the initial loop, calculation of the LLR value for this section is omitted and the value calculated in the initial loop can be used.

From the formula (3), LLR(VCGR31,VCGR32)=ln((G(VCGR32)−G(VCGR31))/(F(VCGR32)−F(VCGR31))) is allocated to the cell transistor MT having the threshold voltage Vth equal to or higher VCGR31 and lower than VCGR32.

From the formula (3), LLR(VCGR32,10)=ln((G(10)−G(VCGR32))/(F(10)−F(VCGR32))) is allocated to the cell transistor MT having the threshold voltage Vth equal to or higher than VCGR32.

As shown in FIG. 27, because the read voltages VCGR31, VCGR32, and VCGR33 are used in the third loop, LLR values for a section lower than VCGR33, a section equal to or higher than VCGR33 and lower than VCGR31, a section equal to or higher than VCGR31 and lower than VCGR32, and a section equal to or higher than VCGR32 are calculated. Frog the formula (3), LLR(0,VCGR33)=ln((G(VCGR33)−G(0))/(F(VCGR33)−F(0))) is allocated to the cell transistor MT having the threshold voltage Vth lower than VCGR33.

From the formula (3), LLR(VCGR33, VCGR31)=ln((G(VCGR31)−G(VCGR33))/(F(VCGR31) F(VCGR33))) is allocated to the cell transistor MT having the threshold voltage Vth equal to or higher than VCGR33 and lower than VCGR31.

From the formula (3), LLR(VCGR31,VCGR32)=ln((G(VCGR32)−G(VCGR31))/(F(VCGR32)−F(VCGR31))) is allocated to the cell transistor MT having the threshold voltage Vth equal to or higher than VCGR31 and lower than VCGR32.

From the formula (3), LLR(VCGR32,10)=ln((G(10)−G(VCGR32))/(F(10)−F(VCGR32))) is allocated to the cell transistor MT having the threshold voltage Vth equal to or higher than VCGR32. Because the section equal to or higher than VCGR32 is the same as that in the second loop, calculation of the LLR value for this section is omitted and the value calculated in the second loop can be used.

According to the third embodiment, as in the first embodiment, the LLR value is calculated. Therefore, the same advantages as those in the first embodiment can be obtained.

In addition, it is not necessary to determine the read voltage VCGR and the number of reads n used for the SB decoding in advance and the SB decoding can be performed for read with any read voltage VCGR and any number of reads n. Therefore, the SB decoding can be performed with a higher success rate than when the read voltage VCGR and the number of reads n are determined.

Furthermore, according to the third embodiment, it is theoretically possible to perform the SB decoding by performing read by the unlimited number. This is because processing for converting a certain number of reads into another corresponding value using a table or like is not necessary. For this reason, more reads are performed as long as processing time allows, so that a success rate of the SB decoding can be increased.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A memory system, comprising:
a semiconductor memory; and
a memory controller configured to:
  obtain first data read from the semiconductor memory using a first voltage,
  obtain second data read from the semiconductor memory using a second voltage,
  calculate a first value for a first section of the first data using the first data and the second data,
  calculate a second value for a second section of the first data using the first data and the second data,
  calculate a third value for a third section of the first data using the first data and the second data, and
  correct an error of the first data using the first to third values, wherein:
the memory controller is further configured to:
when an uncorrectable error is detected in the first data,
obtain third data read from the semiconductor memory using a third voltage,
calculate a fourth value for a fourth section of the first data using the first to third data,
calculate a fifth value for a fifth section of the first data using the first to third data,
calculate a sixth value for a sixth section of the first data using the first to third data,
calculate a seventh value for a seventh section of the first data using the first to third data, and
perform an error correction on the first data using the fourth to seventh values.

2. A memory system, comprising:
a semiconductor memory; and
a memory controller configured to:
obtain first data read from the semiconductor memory using a first voltage,
obtain second data read from the semiconductor memory using a second voltage,
calculate a first value for a first section of the first data using the first data and the second data,
calculate a second value for a second section of the first data using the first data and the second data,
calculate a third value for a third section of the first data using the first data and the second data, and
correct an error of the first data using the first to third values,
wherein:
the first value and the second value have different signs and
the memory controller is further configured to:
instruct to read data from the semiconductor memory n times respectively using the first voltage to an n-th (n is a natural number of three or more) voltage, and
calculate the first to third values, based on an absolute value of a first difference and the n, the first difference being a difference between the first voltage and a voltage most distant from the first voltage among the second to n-th voltages.

3. The system according to claim 2, wherein the memory controller is further configured to:
determine a maximum value for an absolute value for each of the first to third values, based on the absolute value of the first difference and the n, and
calculate the second value based on the absolute value of the first difference, an absolute value of a second difference between the second voltage and the first voltage, and the maximum value.

4. The system according to claim 3, wherein:
the second section includes bits read from cell transistors each having a threshold voltage equal to or higher than the first voltage, and
the memory controller is further configured to calculate the second value based on a ratio between the absolute value of the first difference and the absolute value of the second difference, and the maximum value.

5. The system according to claim 4, wherein:
the memory controller is further configured to calculate the second value based on a product of the ratio and the maximum value.

6. The system according to claim 3, wherein:
the memory controller is further configured to:
determine a candidate for a first maximum value from the absolute value of the first difference based on a first correspondence,
determine a candidate for a second maximum value from the n based on a second correspondence, and
determine the maximum value based on a result of a comparison of the candidate for the first maximum value and the candidate for the second maximum value.

7. The system according to claim 6, wherein:
the third section is a bit read from a cell transistor having a threshold voltage equal to or higher than, among the second to n-th voltages, a voltage having a largest difference from the first voltage, or a bit read from a cell transistor having a threshold voltage lower than the voltage having the largest difference from the first voltage, and
the memory controller is further configured to allocate the maximum value to the third section.

8. The system according to claim 2, wherein:
the memory controller is further configured to:
determine a (n+1)-th voltage based on at least a part of the first to n-th voltages, and
instruct to read data from the semiconductor memory using the (n+1)-th voltage.

9. The system according to claim 8, wherein:
the memory controller is further configured to:
instruct to read data from the semiconductor memory using the first to n-th voltages in ascending order of the first to n-th voltages, and
determine the (n+1)-th voltage by a gradient descent method when an absolute value of a difference between the (n−1)-th voltage and the n-th voltage is smaller than a first predetermined value.

10. The system according to claim 8, wherein:
the memory controller is further configured to:
estimate x-th data (x is a natural number of one to the n) that is estimated to include fewest error bits among the first to n-th data respectively obtained using the first to n-th voltages, and
determine a voltage obtained by subtracting a value from an x-th voltage with which the x-th data is obtained as the (n+1)-th voltage when one of the first to n-th voltages is included in a first range, the first range being a range in which the x-th voltage is highest.

11. The system according to claim 8, wherein:
the memory controller is further configured to:
estimate x-th data (x is a natural number of one to the n) that is estimated to include fewest error bits among the first to n-th data respectively obtained using the first to n-th voltages, and
determine a voltage obtained by adding a value to an x-th voltage with which the x-th data is obtained as the (n+1)-th voltage when one of the first to n-th voltages is included in a first range, the first range being a range in which the x-th voltage is lowest.

12. The system according to claim 8, wherein:
the memory controller is further configured to:
estimate x-th data (x is a natural number of one to n) that is estimated to include fewest error bits among the first to n-th data respectively obtained using the first to n-th voltages, and
determine a voltage between two adjacent voltages having a largest difference among the first to n-th voltages as the (n+1)-th voltage when one of the first to n-th voltages is included in a first range and another one of the first to n-th voltages is included in a second range, the first range being a range in which an x-th voltage is highest and the second range being a range in which the x-th voltage is lowest, the x-th voltage being a voltage with which the x-th data is obtained.

13. The system according to claim 1, wherein:
a number of cell transistors having a threshold voltage v within a first range, which includes the first voltage and the second voltage, is estimated to be f(v) that is calculated by a function f(v) of v,
a number of cell transistors having a threshold voltage v within a second range, which includes the first voltage and the second voltage, is estimated to be g(v) that is calculated by a function g(v) of v, and
the memory controller is further configured to calculate the second value as $$\ln \frac{\sum_{x=a}^{b} g(x)}{\sum_{x=a}^{b} f(x)}$$

where a corresponds to the first voltage and b corresponds to the second voltage.

14. The system according to claim 1, wherein:
a number of cell transistors having a threshold voltage v within a first range, which includes the first voltage and the second voltage, is estimated to be f(v) that is calculated by a function f(v) of v,
a number of cell transistors having a threshold voltage v within a second range, which includes the first voltage and the second voltage, is estimated to be g(v) that is calculated by a function g(v) of v, and
the memory controller is further configured to calculate the second value as $$\ln \frac{G(b) - G(a)}{F(b) - F(a)} \text{ where}$$

$$(x) = \sum_{u=0}^{x} f(u), G(x) = \sum_{u=0}^{x} g(u),$$

with a corresponds to the first voltage, and b corresponds to the second voltage.

15. A system comprising:
a semiconductor memory; and
a memory controller configured to:
  obtain first data read from the semiconductor memory using a first voltage,
  obtain second data read from the semiconductor memory using a second voltage,
  obtain third data read from the semiconductor memory using a third voltage,
  calculate a first value for a first section of the first data using the first to third data,
  calculate a second value for a second section of the first data using the first to third data,
  calculate a third value for a third section of the first data using the first to third data,
  calculate a fourth value for a fourth section of the first data using the first to third data, and
  perform an error correction on the first data using the first to fourth values.

* * * * *